United States Patent [19]

Hirano et al.

[11] Patent Number: 5,617,049

[45] Date of Patent: *Apr. 1, 1997

[54] PULSE SIGNAL GENERATOR AND REDUNDANCY SELECTION SIGNAL GENERATOR

[75] Inventors: Hiroshige Hirano, Nara; Takashi Taniguchi, Osaka, both of Japan

[73] Assignee: Matsushita Electric Industrial Co., Ltd., Osaka, Japan

[*] Notice: The term of this patent shall not extend beyond the expiration date of Pat. No. 5,418,406.

[21] Appl. No.: 508,758

[22] Filed: Jul. 31, 1995

Related U.S. Application Data

[60] Continuation of Ser. No. 247,835, May 23, 1994, abandoned, which is a division of Ser. No. 930,966, Aug. 17, 1992, Pat. No. 5,418,406, which is a division of Ser. No. 674,999, Mar. 26, 1991, Pat. No. 5,163,168.

[30] Foreign Application Priority Data

Mar. 30, 1990 [JP] Japan ................................. 2-086553
Apr. 20, 1990 [JP] Japan ................................. 2-105615

[51] Int. Cl.[6] ................................................. H03K 3/017
[52] U.S. Cl. .................... 327/172; 327/173; 327/174; 327/176; 327/277; 327/263; 327/262
[58] Field of Search .............................. 307/265, 266, 307/267, 272.3, 273, 441, 465, 491, 601, 602, 603, 202.1, 296.4, 296.3, 219, 350, 354; 328/55, 58; 365/96, 200; 327/101, 172, 173, 174, 176, 198, 227, 276, 277, 263, 525, 362, 278, 284

[56] References Cited

U.S. PATENT DOCUMENTS

| | | |
|---|---|---|
| 3,629,620 | 12/1971 | Schroeder ............................... 327/173 |
| 4,580,065 | 4/1986 | Haque ..................................... 327/227 |
| 4,656,612 | 4/1987 | Allan ....................................... 307/591 |
| 4,689,494 | 8/1987 | Chen et al. ............................. 307/219 |
| 4,714,839 | 12/1987 | Chung .................................... 307/219 |
| 4,788,454 | 11/1988 | Tanagawa et al. .................... 307/272.3 |
| 4,837,520 | 6/1989 | Golke et al. ........................... 307/219 |
| 4,847,810 | 7/1989 | Tagami ................................... 307/219 |
| 4,860,260 | 8/1989 | Saito et al. ............................. 365/201 |
| 4,886,983 | 12/1989 | Taka ....................................... 307/272.3 |
| 4,886,984 | 12/1989 | Nakaoka ................................ 307/272.3 |
| 5,038,368 | 8/1991 | Lee ......................................... 307/219 |
| 5,058,059 | 10/1991 | Matsuo et al. ......................... 307/441 |
| 5,073,874 | 12/1991 | Yamada et al. ........................ 307/272.3 |

FOREIGN PATENT DOCUMENTS

| | | |
|---|---|---|
| 0357213 | 3/1990 | European Pat. Off. . |
| 59-81586 | 11/1984 | Japan ..................................... 307/260 |

OTHER PUBLICATIONS

Mano et al, "A Redundancy Circuit for Fault–Tolerant 256K MOS RAM", IEEE Journal of Solid–State Circuits, vol. 5C–17 #4, Aug. 1982, pp. 726–730.

*Primary Examiner*—Terry Cunningham
*Attorney, Agent, or Firm*—Lowe, Price, LeBlanc & Becker

[57] ABSTRACT

A pulse signal generator includes a first delay device for delaying an input pulse signal and converting the input signal into a first intermediate signal. A power supply voltage detector detects a power supply voltage and outputs a signal representative thereof. A second delay device serves to delay the first intermediate signal and to convert the first intermediate signal into a second intermediate signal in response to the output signal from the power supply voltage detector. A logic OR operation is executed between the first and second intermediate signals, and an output signal is generated in response to the first and second intermediate signals. The output signal has a pulse width, which is greater than a pulse width of the input signal when the power supply voltage lies in a predetermined range.

9 Claims, 18 Drawing Sheets

PULSE SIGNAL GENERATOR AND REDUNDANCY SELECTION SIGNAL GENERATOR

This application is a continuation of application Ser. No. 08/247,835 filed May 23, 1994 now abandoned which is a division of application Ser. No. 07/930,966 filed Aug. 17, 1992 now U.S. Pat. No. 5,418,406, which is a division of application Ser. No. 07/674,999 filed Mar. 26, 1991 now U.S. Pat. No. 5,163,168.

BACKGROUND OF THE INVENTION

This invention relates to a pulse signal generator. This invention also relates to a redundancy selection signal generator.

It is good that semiconductor devices such as semiconductor memories can operate in a wide range of a power supply voltage. In some cases, pulse signal generators are used to control semiconductor devices. As will be explained later, a prior art pulse signal generator has some problem.

During the fabrication of semiconductor memories, there is a chance that one or more memory cells go defective. Some semiconductor memories feature a redundancy, including ordinary memory cells and redundant or spare memory cells. When an ordinary memory cell goes defective, the defective memory cell is replaced by a redundant memory cell. This replacement is executed in response to the output signal from a redundancy selection signal generator. As will be explained later, a prior art redundancy selection signal generator has some problems.

SUMMARY OF THE INVENTION

It is an object of this invention to provide an improved pulse signal generator.

It is another object of this invention to provide an improved redundancy selection signal generator.

A first aspect of this invention provides a pulse signal generator comprising first delay means for delaying an input pulse signal and converting the input signal into a first intermediate signal; means for detecting a power supply voltage and outputting a signal representative thereof; second delay means for delaying the first intermediate signal and converting the first intermediate signal into a second intermediate signal in response to the output signal from the detecting means; and means for executing a logic OR operation between the first and second intermediate signals, and generating an output signal in response to the first and second intermediate signals, the output signal having a pulse width which is greater than a pulse width of the input signal when the power supply voltage lies in a predetermined range.

A second aspect of this invention provides a pulse signal generator comprising means for detecting a power supply voltage and outputting a signal representative thereof; means for delaying an input pulse signal and converting the input signal into an intermediate signal in response to the output signal from the detecting means; and means for executing a logic AND operation between the input signal and the intermediate signal, and generating an output signal in response to the input signal and the intermediate signal, the output signal having a pulse width which is greater than a pulse width of the input signal when the power supply voltage lies in a predetermined range.

A third aspect of this invention provides a pulse signal generator comprising a first transistor having a gate subjected to an input pulse signal, a source subjected to a power supply voltage, and a drain, the first transistor being of a first channel-conduction type and having a predetermined source-drain path resistance; a second transistor having a gate subjected to the input pulse signal, a source subjected to a ground potential, and a drain, the second transistor being of a second channel-conduction type which is opposite to the first channel-conduction type, the second transistor having a predetermined source-drain path resistance which differs from the source-drain path resistance of the first transistor; a capacitor having a first end subjected to the ground potential, and a second end; means for detecting a power supply voltage and outputting a signal representative thereof; means for selectively connecting and disconnecting the second end of the capacitor to and from the drains of the first and second transistors in response to the output signal from the detecting means; and means for generating an output signal in response to a signal which is induced at a junction between the capacitor and the drains of the first and second transistors.

A fourth aspect of this invention provides a redundancy selection signal generator comprising means for detecting a power supply voltage and outputting a signal representative thereof; means for adjusting a pulse width of an input pulse signal and converting the input signal into a control pulse signal in response to the output signal from the detecting means; means for generating a redundancy selection signal in response to an address signal; and means for selectively activating and deactivating the generating means in response to the control signal.

DESCRIPTION OF THE PRIOR ART

Figure 1:
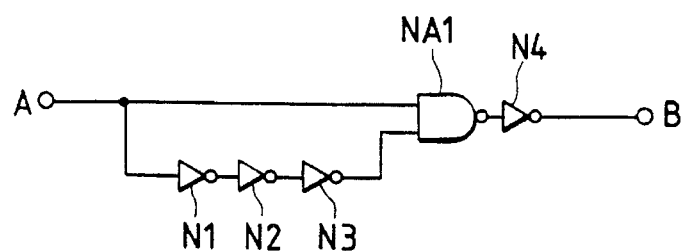
FIG. 1 is a diagram of a prior art pulse signal generator.

With reference to FIG. 1, a prior art pulse signal generator includes an odd number of serially-connected NOT gates N1, N2, and N3 which cooperate to delay an input signal A by a predetermined time. A NAND gate NA1 executes an NAND operation between the input signal A and the output signal from the serial connection of the NOT gates N1, N2, and N3, generating an output signal having a pulse which starts at the moment of the occurrence of a rising edge in the input signal A. A NOT gate N4 executes a NOT operation on the output signal from the NAND gate NA1, generating an output signal B.

Figure 2:
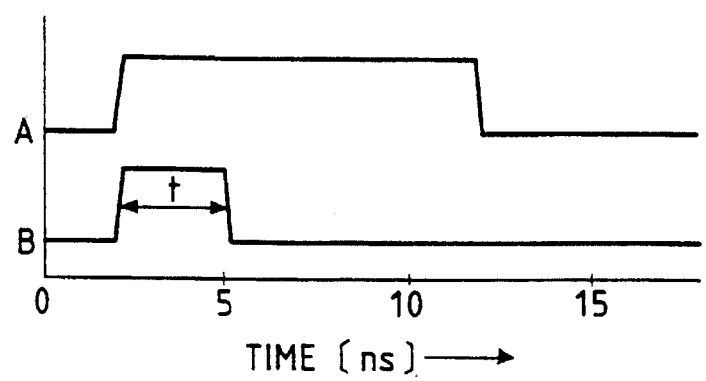
FIG. 2 is a timing diagram showing the waveforms of signals inputted into and outputted from the prior art pulse signal generator of FIG. 1.
Figure 3:
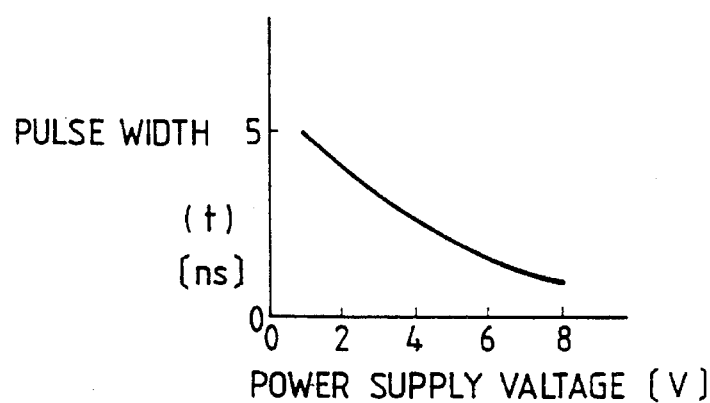
FIG. 3 is a graph showing the relation between a power supply voltage and a pulse width of the output signal from the prior art pulse signal generator of FIG. 1.

In the prior art pulse signal generator of FIG. 1, the input signal A has a rectangular pulse as shown in FIG. 2. The input signal A passes through the NOT gates N1, N2, and N3, reaching the NAND gate NA1. The waveform of the output signal from the NOT gate N3 is inverse with respect to the waveform of the input signal A. In addition, the output signal from the NOT gate N3 is delayed from the input signal A since the input signal A is delayed by each of the NOT gates N1, N2, and N3 when passing therethrough. Thus, the NOT gate N3 outputs a waveform which is delayed from the input signal A by a time equal to the sum of signal delay times of the NOT gates N1, N2, and N3. The NAND gate NA1 outputs a signal representative of the produce of the input signal A and the signal which is inverse in shape with respect to the input signal A and which is delayed from the input signal A by the given time. The output signal from the NAND gate NA1 is inverted by the NOT gate N4, being converted into the output signal B. Therefore, the output signal B has a pulse of a width "t" which corresponds to the sum of the signal delay times of the NOT gates N1, N2, and N3.

Figure 8:
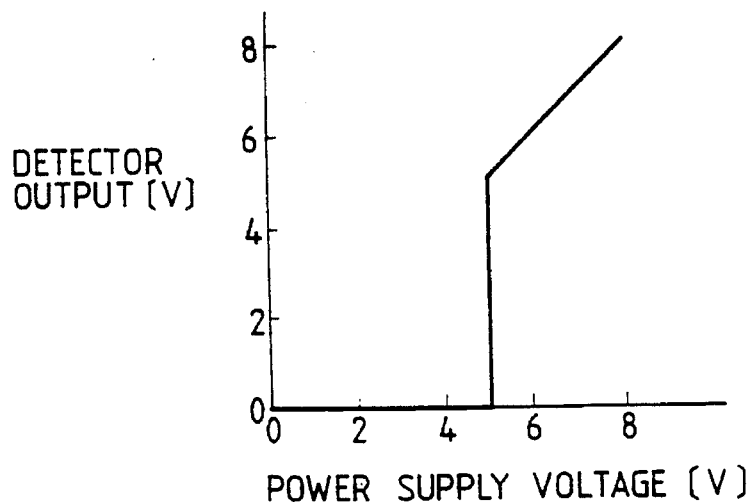
FIG. 8 is a graph showing the relation between a power supply voltage and the output signal voltage of the power supply voltage detector of FIG. 7.

The prior art pulse signal generator of FIG. 1 has a problem as follows. The NOT gates N1–N4 and the NAND gate NA1 are fed with a power supply voltage. As shown in FIG. 8, the pulse width "t" of the output signal B depends on the level of the power supply voltage. Specifically, the pulse width "t" decreases as the level of the power supply voltage rises. This is because the operation speed of the NOT gates N1–N3 increases and thus the signal delay time of the NOT gates N1–N3 decreases as the level of the power supply voltage rises. In the case where the output signal B is used as a control signal for a later circuit, when the power supply voltage excessively rises and thus the pulse width of the output signal B excessively shortens, wrong operation of the later circuit tends to be caused by the output signal B.

Figure 4:
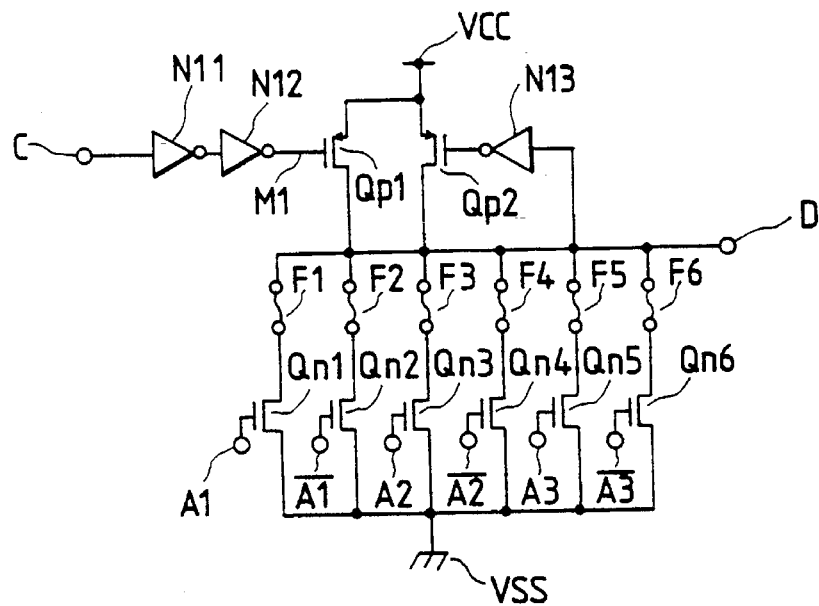
FIG. 4 is a diagram of a prior art redundancy selection signal generator.

With reference to FIG. 4, a prior art redundancy selection signal generator includes NOT gates N11–N13, P-channel MOS transistors Qp1 and Qp2, N-channel MOS transistors Qn1–Qn6, fuses F1–F6, and a node M1. The prior art redundancy selection signal generator of FIG. 4 is associated with a semiconductor memory (not shown) including redundant memory cells in addition to ordinary memory cells. The prior art redundancy selection signal generator receives an input signal C, and outputs a selection signal D. The selection signal D being "HIGH" (shortened to "H" hereinafter) represents that a redundant memory cell should be selected in place of an ordinary memory cell. The selection signal D being "LOW" (shortened to "L" hereinafter) represents that an ordinary memory cell should be selected. The prior art redundancy selection signal generator also receives address signals A1–A3 and $\overline{A1}$–$\overline{A3}$, a power supply voltage VCC, and a ground voltage VSS. The address signals $\overline{A1}$–$\overline{A3}$ are NOT signals with respect to the address signals A1–A3 respectively. During the operation of the semiconductor memory, the address signals are simultaneously fed to both the redundancy selection signal generator and the semiconductor memory.

The fuses F1, F2, F3, F4, F5, and F6 are connected to the transistors Qn1, Qn2, Qn3, Qn4, Qn5, and Qn6 which operate in response to the address signals A1, $\overline{A1}$, A2, $\overline{A2}$, A3, and $\overline{A3}$ respectively. Thus, the fuses F1, F2, F3, F4, F5, and F6 correspond to addresses represented by the address signals A1, $\overline{A1}$, A2, $\overline{A2}$, A3, and $\overline{A3}$.

It is now assumed that a defective ordinary memory cell is detected during the check of the semiconductor memory which is performed after the fabrication of the semiconductor memory. Three of the fuses F1–F6 which correspond to the address of the defective memory cell are physically blown before the shipment of the semiconductor memory.

As will be explained later, during the operation of the semiconductor memory, when the address signals A1, $\overline{A1}$, A2, $\overline{A2}$, A3, and $\overline{A3}$ assume states corresponding to the defective memory cell, the blown fuses enables the redundancy selection signal generator to output an H-level signal D which allows the selection of a redundant memory cell in place of the defective memory cell.

Figure 5:
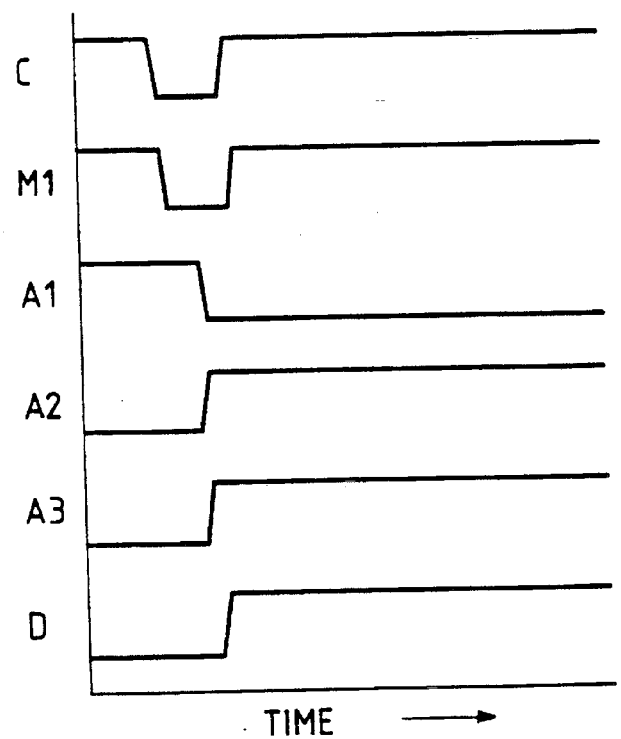
FIGS. 5 and 6 are timing diagrams showing the waveforms of various signals in the prior art redundancy selection signal generator of FIG. 4.

FIG. 5 shows the waveforms of the signals in the prior art redundancy selection signal generator of FIG. 4 which occur under conditions where a redundant memory cell is selected for a defective ordinary memory cell. It is now assumed that the fuses F2, F3, and F5 are previously blown in correspondence with the address of a defective ordinary memory cell. Further, at a given time: the address signal A1 is "L"; the address signal A2 is "H"; the address signal A8 is "H"; and the selection signal D is "H".

Under normal conditions, the prior art redundancy selection signal generator of FIG. 4 operates as follows. The input signal C is normally "H". Only when the address signals are in transition, the input signal C assumes "L". The input signal C passes through a series combination of the NOT gates N11 and N12, reaching the node M1. The signal which appears at the node M1 has a waveform similar in shape to the waveform of the input signal C. However, the signal at the node M1 is delayed from the input signal C by signal delay operation of the NOT gates N11 and N12.

When the address signals are in transition, the input signal C assumes "L" and then the signal at the node M1 assumes "L". As a result, the transistor Qp1 connected to the node M1 becomes conductive, and the selection signal D assumes a level corresponding to the power supply voltage VCC.

When the address signals A1, A2, and A3 assume the states corresponding to the address of the defective ordinary memory cell, that is, the address signals A1, A2, and A3 assume "L", "H", and "H" respectively, the transistors Qn2, Qn3, and Qn5 become conductive. Since the fuses F2, F3, and F5 connected to the transistors Qn2, Qn3, and Qn5 are blown as described previously. the level of the selection signal D does not drop to the ground voltage VSS and thus the selection signal D remains "H". The inversion of the selection signal D, that is, the "L" signal, is fed to the gate of the transistor Qp2 by the NOT gate N13, so that the transistor Qp2 becomes conductive and the selection signal D remains at the level corresponding to the power supply voltage VCC. In this way, the selection signal D remains "H". In the semiconductor memory, the selection signal being "H" enables the selection of a redundant memory cell in place of the defective ordinary memory cell.

When the address signals A1, A2, and A3 assume states corresponding to the addresses of normal ordinary memory cells, at least one of the transistors Qn1, Qn4, and Qn6 becomes conductive. Since the fuses F1, F4, and F6 connected to the transistors Qn1, Qn4, and Qn6 are unblown, the level of the selection signal D drops to a level corresponding to the ground voltage VSS and thus the selection signal D goes "L". The inversion of the selection signal D, that is, the "H" signal, is fed to the gate of the transistor Qp2 by the NOT gate N13, so that the transistor Qp2 is nonconductive and the selection signal D reliably falls into and remains at the level corresponding to the ground voltage VSS. In this way, the selection signal D remains "L". In the semiconductor memory, the selection signal being "L" enables the selection of an ordinary memory cell.

Figure 6:
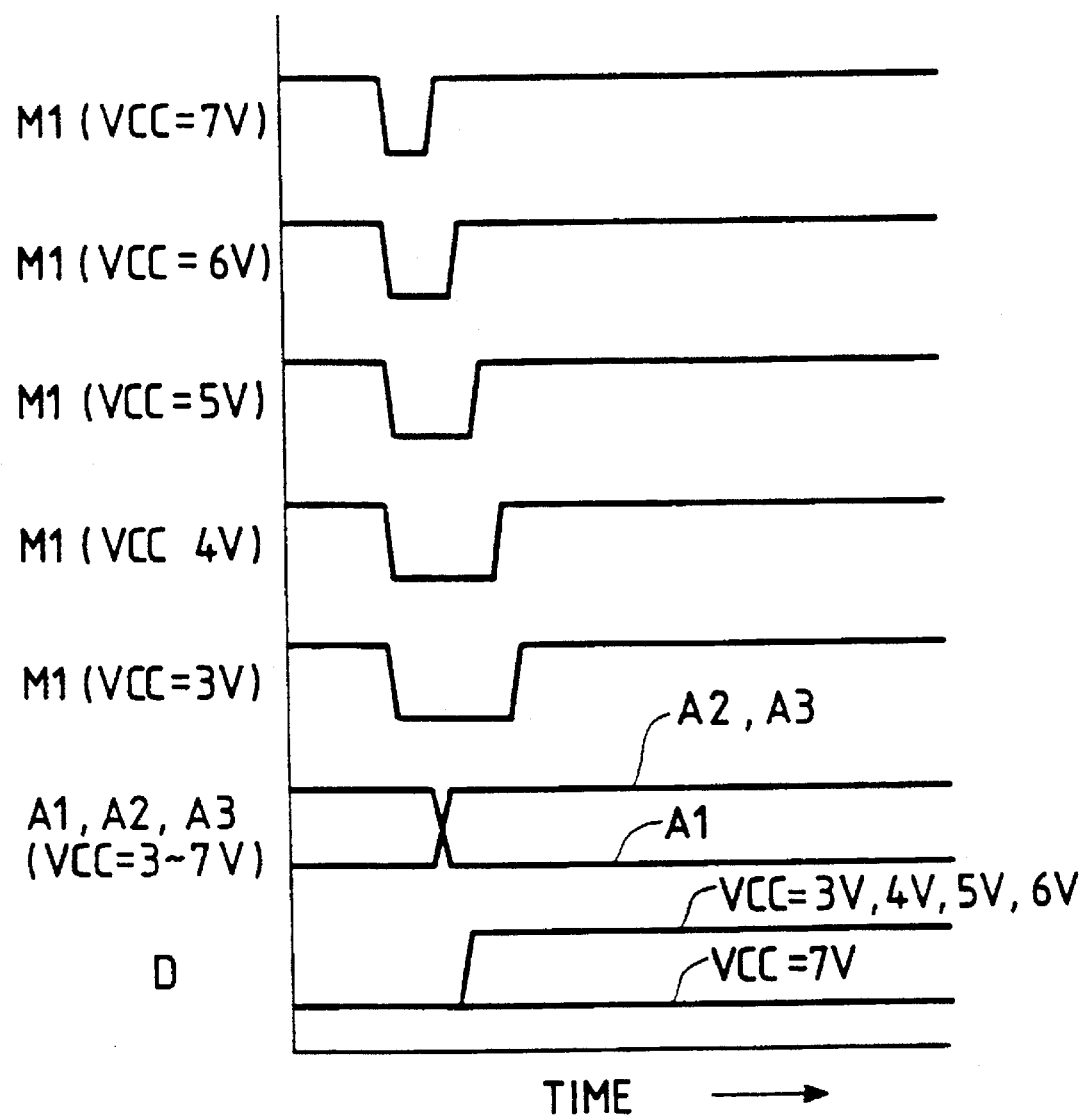

The prior art redundancy selection signal generator of FIG. 4 has a problem as follows. The NOT gates N11 and N12 are fed with a power supply voltage. As shown in FIG. 6, the state-change timing and the pulse width of the signal at the node M1 depend on the level of the power supply voltage under conditions where the pulse width of the input signal C decreases as the power supply voltage increases. Specifically, the state-change timing becomes earlier and the pulse width decreases as the level of the power supply voltage rises. This is because the operation speed of the NOT gates N11 and N12 increases and thus the signal delay time of the NOT gates N11 and N12 decreases as the level of the power supply voltage rises. On the other hand, the transition time of the address signals A1, $\overline{A1}$, A2, $\overline{A2}$, A3, and $\overline{A3}$ remains independent of the power supply voltage. Therefore, in the case where the power supply voltage rises excessively, the state-change timing of the signal at the node M1 is excessively shifted relative to the transition time of the address signals so that the selection signal D tends to be inaccurate as will be explained hereinafter.

In the ease where the address signals assume the states corresponding to the defective ordinary memory cell, the state of the selection signal D is determined by the state of the signal at the node M1 which occurs at the transition of the address signals. Specifically, at the power supply voltage in the range of 3 volts to 6 volts, the selection signal D is enabled to change from "L" to "H" as shown in FIG. 6. On the other hand, at the power supply voltage being equal to 7 volts, the selection signal D remains "L" since the state-change timing of the signal at the node M1 is excessively early and thus the signal at the node M1 is "H" at the moment of the transition of the address signals.

DESCRIPTION OF THE FIRST PREFERRED EMBODIMENT

Figure 7:
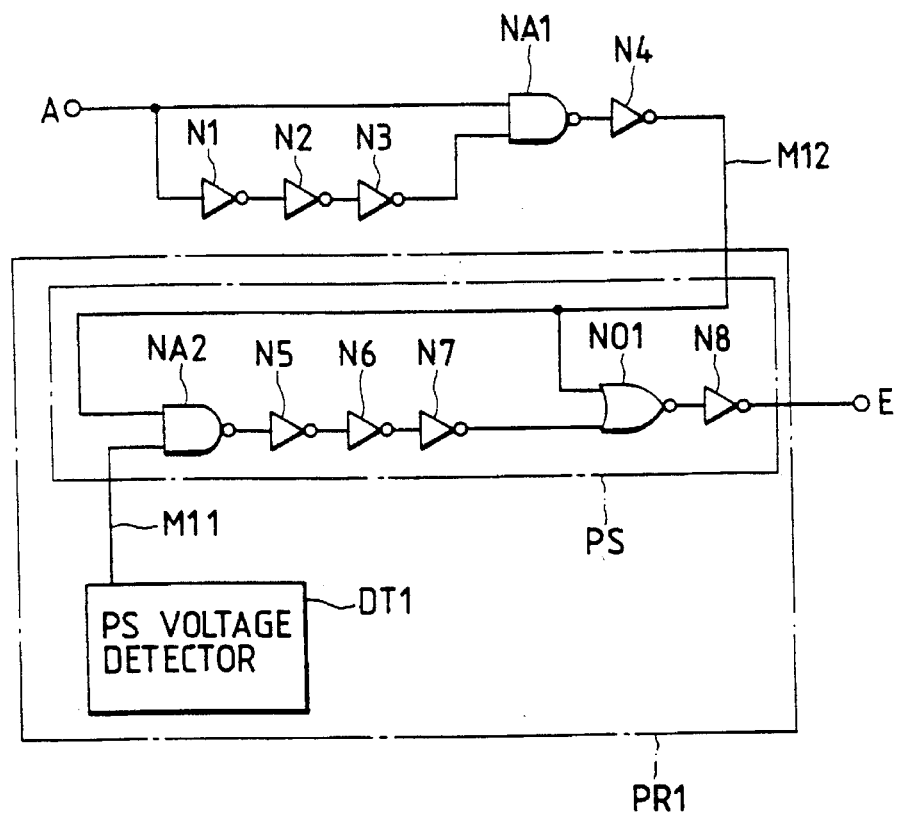
FIG. 7 is a diagram of a pulse signal generator according to a first embodiment of this invention.

With reference to FIG. 7, a pulse signal generator includes an odd number of serially-connected NOT gates N1, N2, and N3 which cooperate to delay an input signal A by a predetermined time. A NAND gate NA1 executes an NAND operation between the input signal A and the output signal from the serial connection of the NOT gates N1, N2, and N3, generating an output signal having a pulse which starts at the moment of the occurrence of a rising edge in the input signal A. A NOT gate N4 executes a NOT operation on the output signal from the NAND gate NA1, outputting a signal which is the inversion of the output signal from the NAND gate NA1. The output signal from the NOT gate N4 is fed to a pulse width varying circuit PS via a node M12.

The pulse width varying circuit PS includes a NAND gate NA2, a series combination of NOT gates N5, N6, and N7, a NOR gate NO1, and a NOT gate N8. A first input terminal of the NAND gate NA2 receives the output signal from the NOT gate N4 via the node M12. A second input terminal of the NAND gate NA2 receives the output signal from a power supply voltage detector DT1 via a node M11. The NAND gate NA2 executes a NAND operation between the output signals from the devices N4 and DT1. The output signal from the NAND gate NA2 is fed to the series combination of the NOT gates N5–N7. The output signal from the series combination of the NOT gates N5–N7 is applied to a first input terminal of the NOR gate NO1. A second input terminal of the NOR gate NO1 receives the output signal from the NOT gate N4 via the node M12. The NOR gate NO1 executes a NOR operation between the output signals from the NOT gate series combination and the NOT gate N4. The output signal from the NOR gate NO1 is fed to the NOT gate N8. The NOT gate N8 executes a NOT operation on the output signal from the NOR gate NO1, outputting a signal E which is used as an output signal from the pulse signal generator. The pulse width varying circuit PS and the power supply voltage detector DT1 compose a pulse signal adjuster PR1.

The gates N1–N8, NA1, NA2, and NO1 are driven by a common power supply voltage. The power supply voltage detector DT1 detects the power supply voltage and outputs a voltage signal which varies as a predetermined function of the power supply voltage. As shown in FIG. 8, at the power supply voltage in the range of 0 volt to 5 volts, the voltage of the output signal from the power supply voltage detector DT1 remains 0, that is, the output signal from the power supply voltage detector DT1 remains in the logic state "L". At the power supply voltage being equal to or higher than 5 volts, the voltage of the output signal from the power supply voltage detector DT1 agrees with the power supply voltage so that the output signal from the power supply voltage detector DT1 is in the logic state "H". As will be made clear later, the pulse width varying circuit PS is activated and deactivated by the "H" signal and the "L" signal outputted from the power supply voltage detector DT1 respectively.

The power supply voltage detector DT1 has a known design. For example, the power supply voltage detector DT1 includes a comparator and a switch. The comparator compares the power supply voltage with a reference voltage (5 volts). The switch operates in response to the output signal from the comparator. When the power supply voltage is smaller than the reference voltage, the switch selects a ground voltage (0 volt) as an output signal from the power supply voltage detector DT1. When the power supply voltage is equal to or higher than the reference voltage, the switch selects the power supply voltage as an output signal from the power supply voltage detector DT1.

Figure 9:
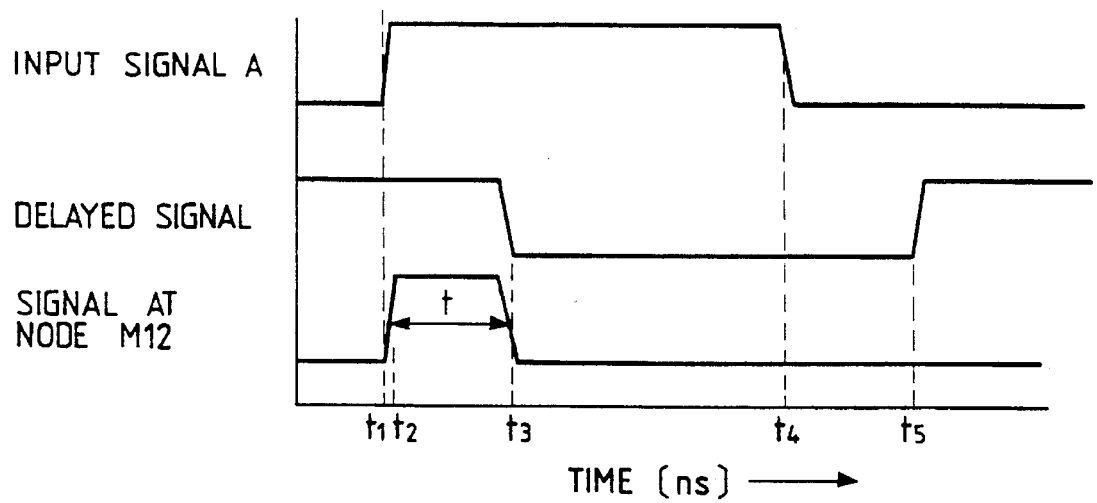
FIG. 9 is a timing diagram showing the waveforms of signals in the pulse signal generator of FIG. 7.

In the pulse signal generator of FIG. 7, the input signal A has a rectangular pulse as shown in FIG. 9. Specifically, the input signal A remains "L" until a moment t1, and changes to "H" at the moment t1. The input signal remains "H" until a moment t4, and returns to "L" at the moment t4. After the moment t4, the input signal A remains "L".

The input signal A passes through the NOT gates N1, N2, and N3, reaching the NAND gate NA1. The waveform of the output signal from the NOT gate N3 is inverse with respect to the waveform of the input signal A. In addition, the output signal from the NOT gate N3 is delayed from the input signal A since the input signal A is delayed by each of the NOT gates N1, N2, and N3 when passing therethrough. Thus, the NOT gate N3 outputs a signal which is inverse in waveform with respect to the input signal A and which is delayed from the input signal A by a time "t" equal to the sum of signal delay times of the NOT gates N1, N2, and N3. The output signal from the NOT gate N3, that is, the delayed input signal into the NAND gate NA1, changes its state at moments t3 and t5 which follows the moments t1 and t4 by the given interval "t" as shown in FIG. 9. The NAND gate NA1 outputs a signal representative of the product of the input signal A and the signal which is inverse with respect to the input signal A and which is delayed from the input signal A by the given time "t". The output signal from the NAND gate NA1 is inverted and delayed by the NOT gate N4, being converted into a signal which appears at the node M12. Therefore, the output signal from the NOT gate N4, that is, the signal at the node M12, has a pulse of a width "t" which corresponds to the sum of the signal delay times of the NOT gates N1, N2, and N3. In addition, the pulse in the signal at the node M12 starts an a moment t2 which follows the moment t1 by a given time.

Figure 10:
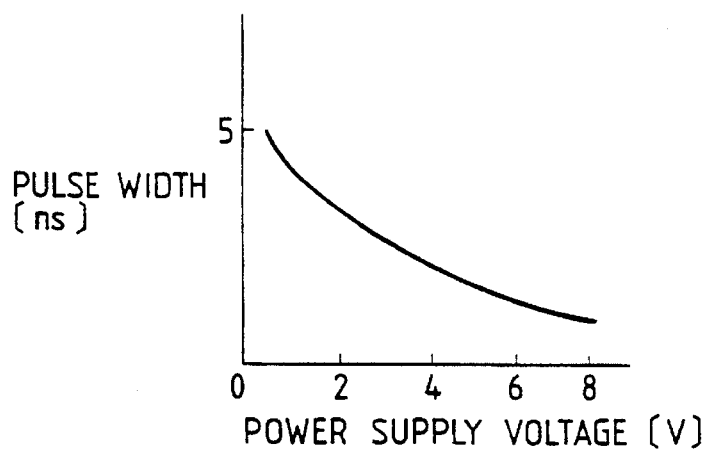
FIG. 10 is a graph showing the relation between the power supply voltage and a pulse width of a signal in the pulse signal generator of FIG. 7.

As shown in FIG. 10, the pulse width "t" of the signal at the node M12 depends on the level of the power supply voltage. Specifically, the pulse width "t" decreases as the level of the power supply voltage rises. This is because the operation speed of the NOT gates N1–N3 increases and thus the signal delay time of the NOT gates N1–N3 decreases as the level of the power supply voltage rises.

The pulse signal generator of FIG. 7 operates as follows. In the case where the power supply voltage is lower than 5 volts, the power supply voltage detector DT1 outputs an "L" signal to the NAND gate NA2 of the pulse width varying circuit PS so that the NAND gate NA2 is closed. As a result, the combination of the gates NA2 and N5–N7 is deactivated, and the signal at the node M12 passes through the gates NO1 and N8 without undergoing any substantive modification. Thus, the output signal E substantially agrees with the signal at the node M12.

Figure 11:
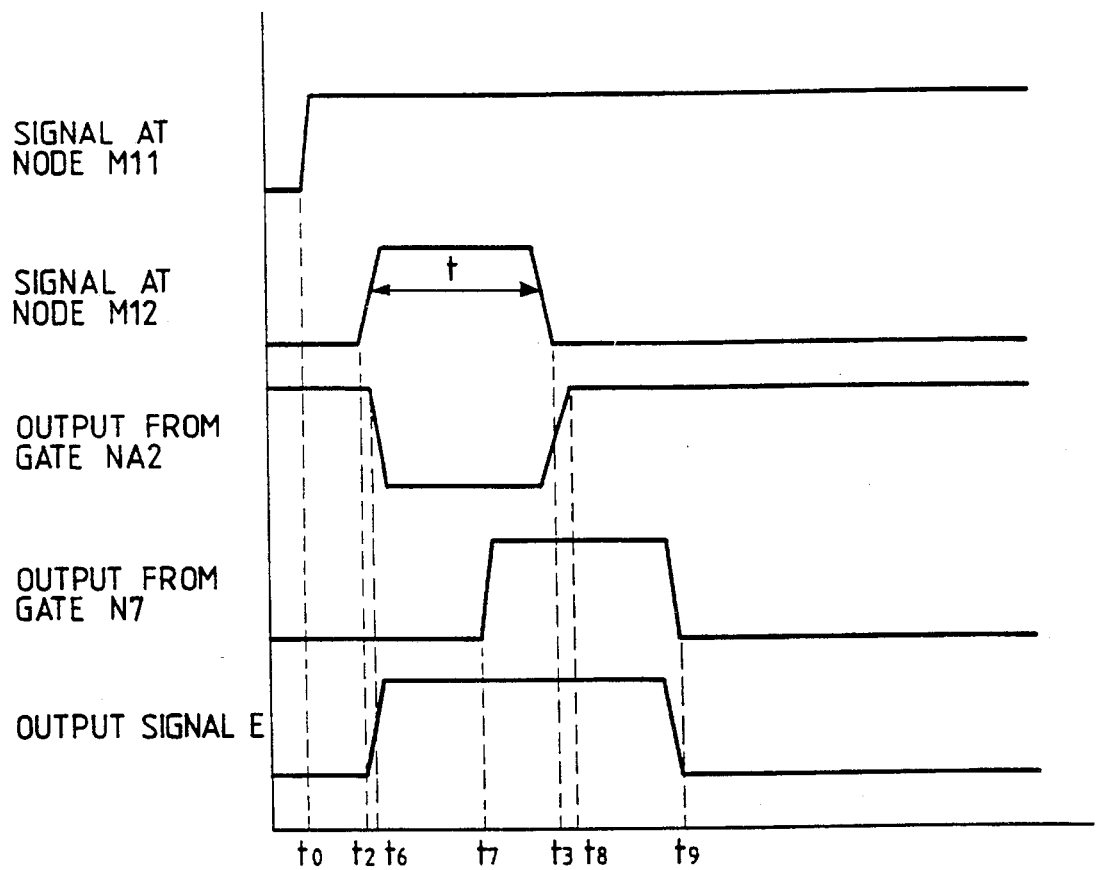
FIG. 11 is a timing diagram showing the waveforms of signals in the pulse signal generator of FIG. 7.

It is now assumed that, as shown in FIG. 11, the power supply voltage rises to and above 5 volts and thus the output signal from the power supply detector DT1 (the signal at the node M11) changes to "H" at a moment t0. The NAND gate NA2 of the pulse width varying circuit PS is opened by the "H" signal from the power supply detector DT1, outputting a signal reflecting the signal at the node M12. As shown in FIG. 11, the output signal from the NAND gate NA2 is inverse with respect to the signal at the node M12 and changes its state at moments t6 and t8 which follow moments t2 and t3 of state changes of the signal at the node M12 by a given time. The output signal from the NAND gate NA2 is successively inverted by the NOT gates N5–N7 while being delayed by the NOT gates N5–N7 by a given time equal to the sum of signal delay times of the NOT gates N5–N∂. Thus, the NOT gate N7 outputs a signal which is inverse with respect to the output signal from the NAND gate NA2 and which is delayed from the output signal from the NAND gate NA2 by the given time as shown in FIG. 11. Specifically, the state of the output signal from the NOT gate N7 changes at moments t7 and t9 which follow the moments t6 and t8 of the state changes of the output signal from the NAND gate NA2 by the given time. The output signal from the NOT gate N7 is similar in waveform to the signal at the node M12 but is delayed from the signal at the node M12 by a given time equal to the interval between the moments t2 and t7. The NOR gate NO1 executes the NOR operation between the output signal from the NOT gate N7 and the signal at the node M12 (the output signal from the NOT gate N4), and the output signal from the NOR gate NO1 is inverted by the NOT gate N8 into the output signal E. The NOR gate NO1 and the NOT gate N8 cooperate to combine pulses of the output signals from the gates N4 and N7 into a longer pulse of the output signal E. Specifically, as shown in FIG. 11, the output signal E remains "L" until the moment t2 of the state change of the signal at the node M12, and changes to "H" at the moment t2. During the interval between the moment t2 and the moment t9 of the state change of the output signal from the NOT gate N7, the output signal E remains "H". The output signal E returns to "L" at the moment t9, and remains "L" after the moment t9. The pulse width of the output signal E agrees with the interval between the moments t2 and t9, while the pulse width of the signal at the node M12 agrees with the interval between the moments t2 and t3. Thus, the pulse width of the output signal E is greater than the pulse width of the signal at the node M12.

As understood from the previous description, in the predetermined range of higher power supply voltages, the pulse width varying circuit PS increases the width of a positive pulse of its input signal in response to the output signal from the power supply voltage detector DT1, and outputs a signal having a positive pulse which is longer than the positive pulse of the input signal and which is synchronous with the positive pulse of the input signal. Specifically, the increase of the width of the positive pulse is realized by effectively delaying the change of the input signal from "H" to "L" but substantially undelaying the change of the input signal from "L" to "H". In this embodiment, the pulse width varying circuit PS operates on the output signal from the NOT gate N4.

Figure 12:
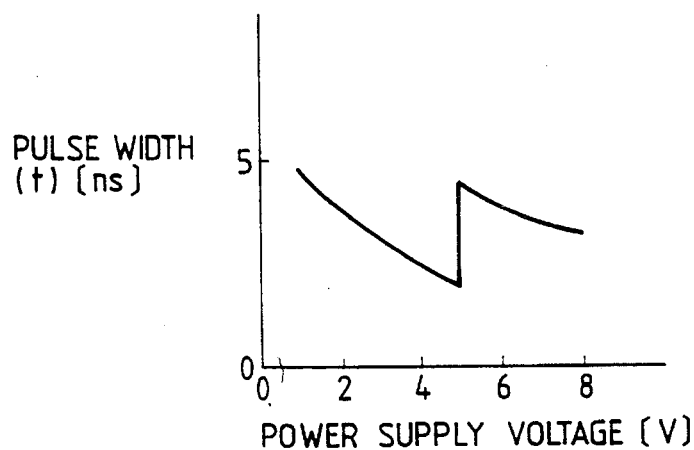
FIG. 12 is a graph showing the relation between the power supply voltage and a pulse width of the output signal from the pulse signal generator of FIG. 7.

As shown in FIG. 12, the width of a pulse in the output signal E decreases as the power supply voltage increases toward 5 volts. When the power supply voltage reaches 5 volts, the width of a pulse in the output signal E is increased by the operation of the pulse width varying circuit PS. The width of a pulse in the output signal E again decreases as the power supply voltage increases above 5 volts. As understood from FIG. 12, the pulse width varying circuit PS prevents the pulse width of the output signal E from excessively decreasing at the power supply voltage in a higher range.

It should be noted that the series combination of the NOT gates N5–N7 may be replaced by a series combination of another odd number of NOT gates.

DESCRIPTION OF THE SECOND PREFERRED EMBODIMENT

Figure 13:
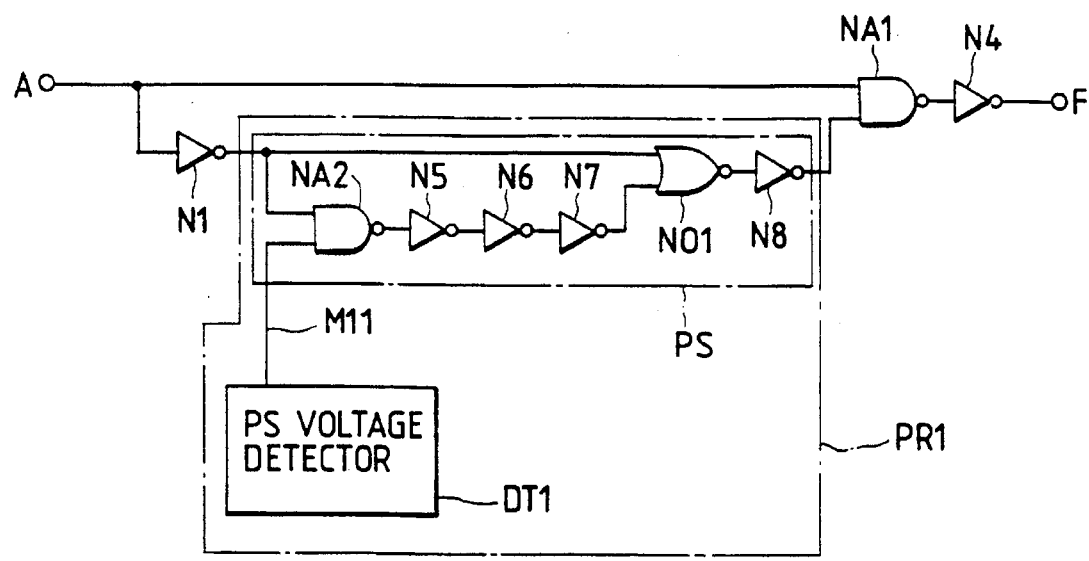
FIG. 13 is a diagram of a pulse signal generator according to a second embodiment of this invention.

FIG. 13 shows a pulse signal generator according to a second embodiment of this invention which is similar to the embodiment of FIGS. 7–12 except for design changes indicated hereinafter. In the embodiment of FIG. 13, NOT gates N2 and N8 (see FIG. 7) are removed, and a pulse width varying circuit PS is disconnected from the output terminal of a NOT gate 4 and is interposed between a NOT gate N1 and a NAND gate NA1. In other words, the combination of the NOT gates N2 and N3 (see FIG. 7) is replaced by the pulse width varying circuit PS. The output signal from the NOT gate N1 is fed to a NAND gate NA2 within the pulse width varying circuit PS, and the output signal from a NOT gate N8 within the pulse width varying circuit PS is fed to the NAND gate NA1. The NOT gate N4 outputs a signal F which is used as an output signal from the pulse signal generator.

As described previously, the pulse width varying circuit PS is activated by the output signal from a power supply voltage detector DT1 in a predetermined range of higher power supply voltages. When the pulse width varying circuit PS is activated, the pulse width varying circuit PS effectively delays the change of its input signal from "H" to "L" but substantially undelays the change of the input signal from "L" to "H". In this embodiment, the pulse width varying circuit PS operates on the output signal from the NOT gate N1.

The pulse signal generator of FIG. 13 operates as follows. In the case where the power supply voltage is lower than 5 volts, the power supply voltage detector DT1 outputs an "L" signal to the NAND gate NA2 of the pulse width varying circuit PS so that the NAND gate NA2 is closed. As a result, the combination of the gates NA2 and N5–N7 is deactivated, and the output signal from the NOT gate N1 passes through the gates NO1 and N8 without undergoing any substantive modification. In this case, the input signal A passes through the gates N1, NO1, and N8, reaching the NAND gate NA1. The waveform of the output signal from the NOT gate N8 is inverse with respect to the waveform of the input signal A. In addition, the output signal from the NOT gate N8 is delayed from the input signal A since the input signal A is delayed by each of the gates N1, NO1, and N8 when passing therethrough. Thus, the NOT gate N8 outputs a signal which is delayed from the input signal A by a time equal to the sum of signal delay times of the gates N1, NO1, and N8. The NAND gate NA1 outputs a signal representative of the product of the input signal A and the signal which is inverse in shape with respect to the input signal A and which is delayed from the input signal A by the given time. The output signal from the NAND gate NA1 is inverted by the NOT gate N4, being converted into the output signal F. Therefore, the output signal F has a pulse of a width which corresponds to the sum of the signal delay times of the gates N1, NO1, and N8.

Figure 14:
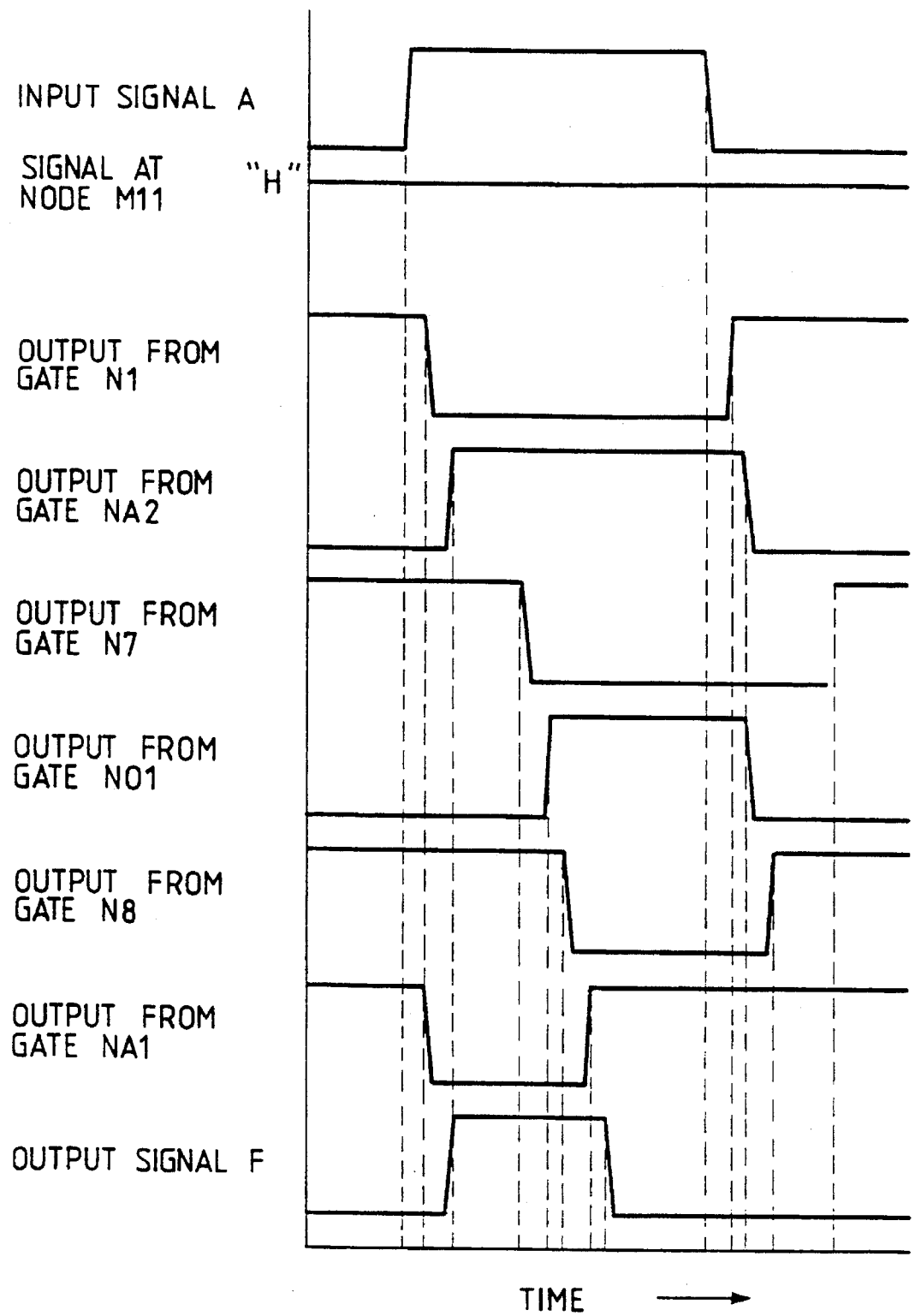
FIG. 14 is a timing diagram showing the waveforms of signals in the pulse signal generator of FIG. 13.

It is now assumed that, the power supply voltage is equal to or higher than 5 volts and thus the output signal from the power supply detector DT1 (the signal at the node M11) is "H" as shown in FIG. 14. The NAND gate NA2 of the pulse width varying circuit PS is opened by the "H" signal from the power supply detector DT1, outputting a signal reflecting the signal at the output terminal of the NOT gate N1. As shown in FIG. 14, the output signal from the NOT gate N1 is inverse with respect to the input signal A and is delayed from the input signal A by a given time, and the output signal from the NAND gate NA2 is inverse with respect to the signal at the output terminal of the NOT gate N1 and is delayed from the signal at the output terminal of the NOT gate N1 by a given time. The output signal from the NAND gate NA2 is successively inverted by the NOT gates N5–N7 while being delayed by the NOT gates N5–N7 by a given time equal to the sum of signal delay times of the NOT gates N5–N7. Thus, the NOT gate N7 outputs a signal which is inverse with respect to the output signal from the NAND gate NA2 and which is delayed from the output signal from the NAND gate NA2 by the given time as shown in FIG. 14. The output signal from the NOT gate N7 is similar in waveform to the output signal from the NOT gate N1 but is delayed from the output signal from the NOT gate N1 by a given time equal to the sum of the signal delay times of the gates NA2 and N5–N7. The NOR gate NO1 executes the NOR operation between the output signals from the NOT gates N1 and N7, and the output signal from the NOR gate NO1 is inverted by the NOT gate N8 while being delayed by a given time. The NOR gate NO1 outputs a positive pulse which is started synchronously with the change of the output signal from the NOT gate N7 from "H" to "L" and which is ended synchronously with the change of the output signal from the NOT gate N1 from "L" to "H". The output signal from the NOR gate NO1 is inverted by the the NOT gate N8 while being delayed by a given time. As understood from the comparison between the waveforms of the output signals of the NOT gates N1 and N8, the pulse width varying circuit PS decreases the width of a negative pulse of the output signal from the NOT gate N1 by effectively delaying the leading edge of the negative pulse but substantially undelaying the trailing edge of the negative pulse. The NAND gate NA1 executes the NAND operation between the input signal A and the output signal from the NOT gate N8, outputting a signal representative of the product of the input signal A and the output signal from the NOT gate N8. Thus, the output signal from the NAND gate NA1 has a negative pulse which is started synchronously with the change of the input signal A from "L" to "H" and which is ended synchronously with the change of the output signal of the NOT gate N8 from "H" to "L". The output signal from the NAND gate NA1 is inverted by the NOT gate N4 and is delayed by the NOT gate N4, being converted into the output signal F. Therefore, the output signal F has a positive pulse which is delayed from the negative pulse of the output signal from the NAND gate NA1 by a given time. Since the pulse width varying circuit PS effectively delays the change of the output signal of the NOT gate N1 from "H" to "L", the negative pulse of the output signal from the NAND gate NA1 and the positive pulse of the output signal F have a longer width in comparison with that obtained when the pulse width varying circuit PS is deactivated.

Figure 15:
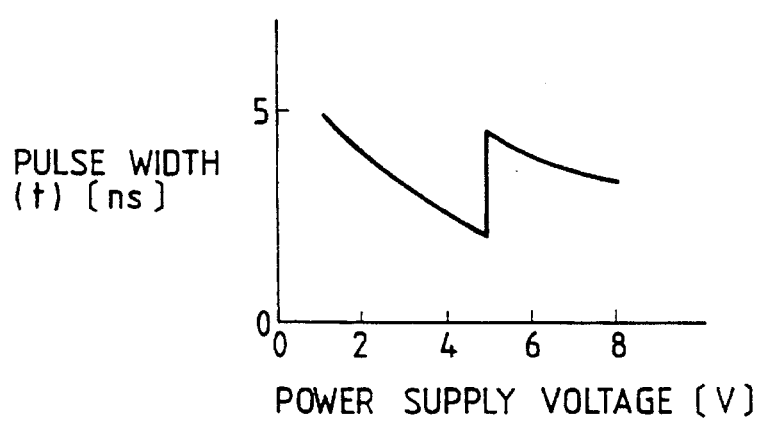
FIG. 15 is a graph showing the relation between the power supply voltage and a pulse width of the output signal from the pulse signal generator of FIG. 13.

As shown in FIG. 15, the width of a pulse in the output signal F decreases as the power supply voltage increases toward 5 volts. When the power supply voltage reaches 5 volts, the width of a pulse in the output signal F is increased by the operation of the pulse width varying circuit PS. The width of a pulse in the output signal F again decreases as the power supply voltage increases above 5 volts. As understood from FIG. 15, the pulse width varying circuit PS prevents the pulse width of the output signal F from excessively decreasing at the power supply voltage in a higher range.

DESCRIPTION OF THE THIRD PREFERRED EMBODIMENT

Figure 16:
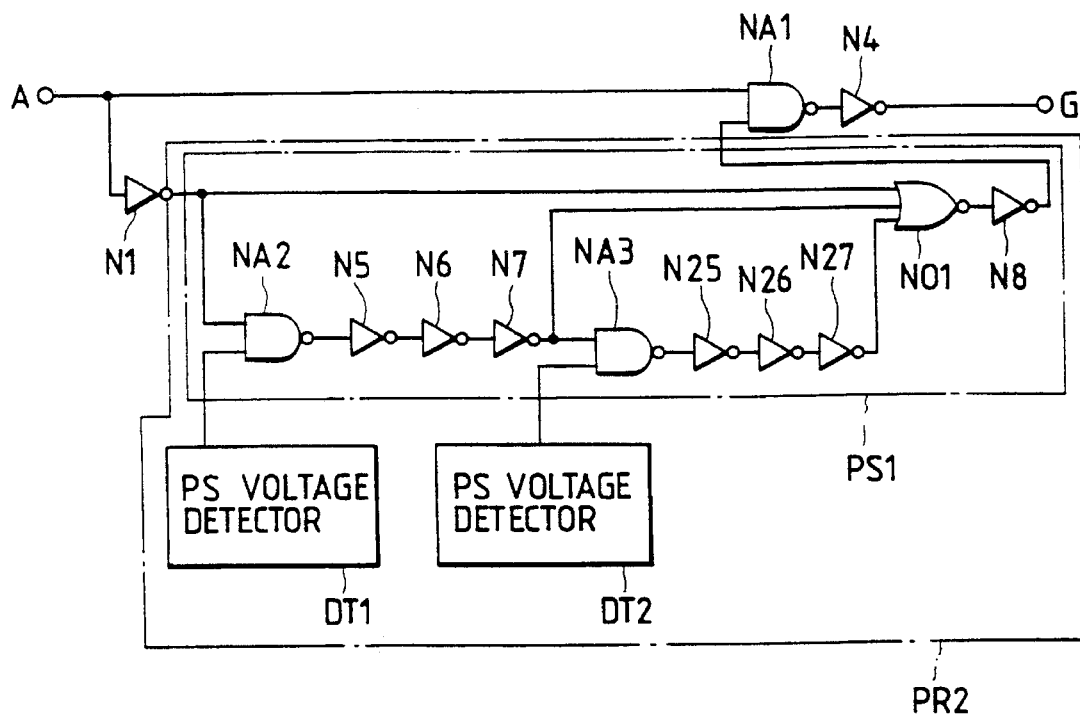
FIG. 16 is a diagram of a pulse signal generator according to a third embodiment of this invention.

FIG. 16 shows a pulse signal generator according to a third embodiment of this invention which is similar to the embodiment of FIGS. 13–15 except for an additional design indicated hereinafter. The embodiment of FIG. 16 includes a modified pulse signal adjuster PR2 and a modified pulse width varying circuit PS1. The pulse signal adjuster PR2 additionally includes a power supply voltage detector DT2. The pulse width varying circuit PS1 additionally includes a NAND gate NA3, and NOT gates N25, N26, and N27. A first input terminal of the NAND gate NA3 receives the output signal from a NOT gate N7. A second input terminal of the NAND gate NA3 receives the output signal from the power supply voltage detector DT2. The NAND gate NA3 executes a NAND operation between the output signals from the devices N7 and DT2. The NOT gates N25–N27 are connected in series. The series combination of the NOT gates N25–N27 follows the NAND gate NA3. The output signal from the NOT gate N27 is applied to a third input terminal of a NOR gate NO1. The NOR gate NO1 executes a NOR operation among the output signals from a NOT gate N1, the NOT gate N7, and the NOT gate N27. The combinations of the gates NA3 and N25–N27 operates similarly to the operation of the combination of the gates NA2 and N5–N7.

Figure 17:
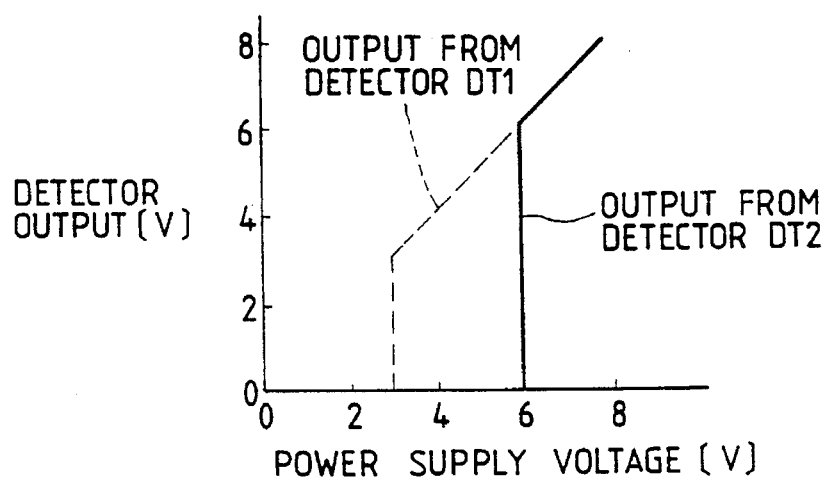
FIG. 17 is a graph showing the relation between a power supply voltage and the output signal voltages of the power supply voltage detectors of FIG. 16.

As shown in FIG. 17, at the power supply voltage in the range of 0 volt to 8 volts, the voltage of the output signal from the power supply voltage detector DT1 remains 0, that is, the output signal from the power supply voltage detector DT1 remains in the logic state "L". At the power supply voltage being equal to or higher than 5 volts, the voltage of the output signal from the power supply voltage detector DT1 agrees with the power supply voltage so that the output signal from the power supply voltage detector DT1 is in the logic state "H".

As shown in FIG. 17, at the power supply voltage in the range of 0 volt to 6 volts, the voltage of the output signal from the power supply voltage detector DT2 remains 0, that is, the output signal from the power supply voltage detector DT2 remains in the logic state "L". At the power supply voltage being equal to or higher than 6 volts, the voltage of the output signal from the power supply voltage detector DT2 agrees with the power supply voltage so that the output signal from the power supply voltage detector DT2 is in the logic state "H".

Figure 18:
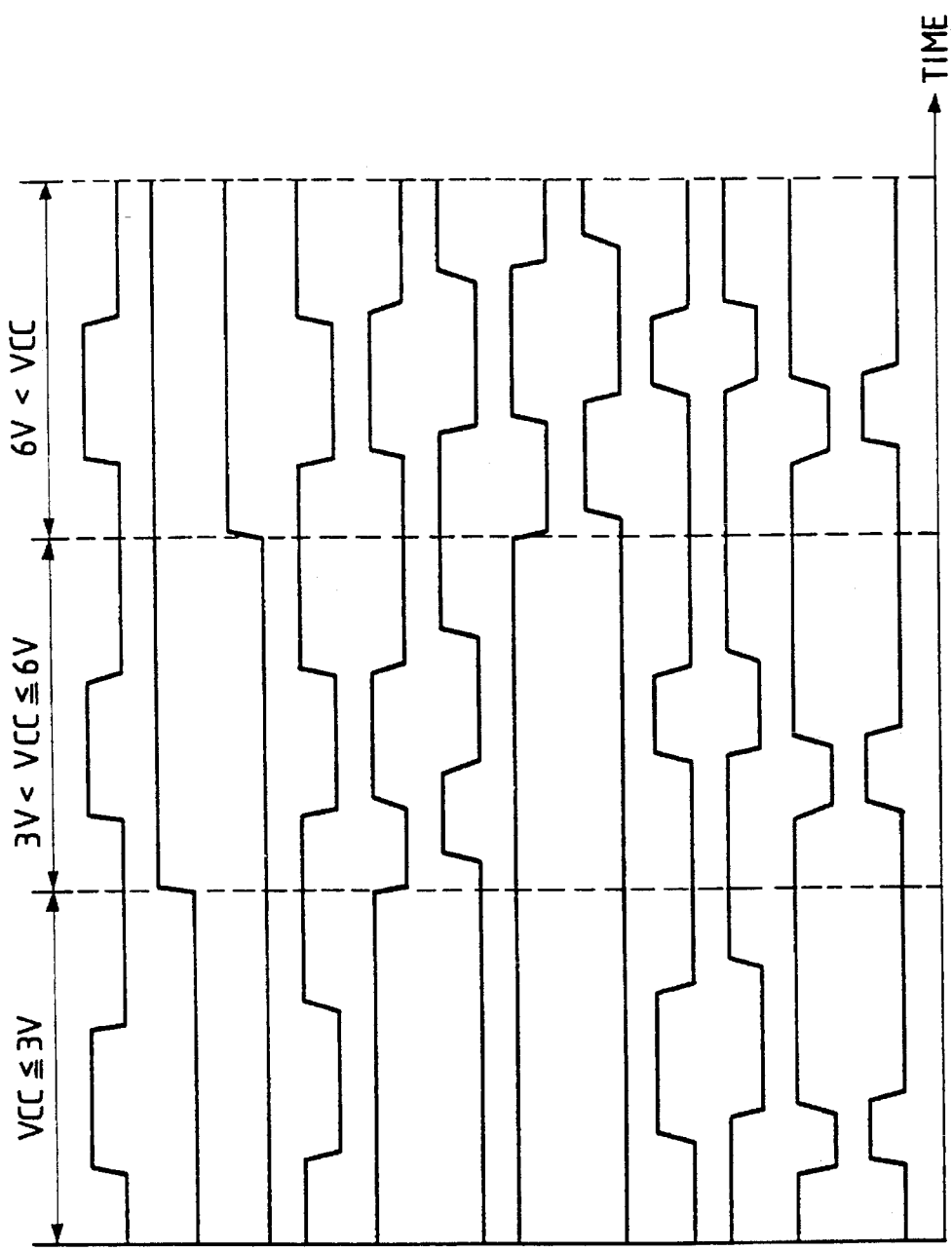
FIG. 18 is a timing diagram showing the waveforms of signals in the pulse signal generator of FIG. 16.

The pulse signal generator of FIG. 16 operates as follows. In the case where the power supply voltage is lower than 3 volts, the power supply voltage detectors DT1 and DT2 output "L" signals to the NAND gates NA2 and NA3 of the pulse width varying circuit PS1 as shown in FIG. 18 so that the NAND gates NA2 and NA3 are closed. As a result, the combination of the gates NA2 and N5–N7 and also the combination of the gates NA3 and N25–N27 are deactivated, and the output signal from the NOT gate N1 passes through the gates NO1 and N8 without undergoing any substantive modification. In this case, the input signal A passes through the gates N1, NO1, and N8, reaching a NAND gate NA1. As shown in FIG. 18, the waveform of the output signal from the NOT gate N8 is inverse with respect to the waveform of the input signal A. In addition, the output signal from the NOT gate N8 is delayed from the input signal A since the input signal A is delayed by each of the gates N1, NO1, and N8 when passing therethrough. Thus, the NOT gate N8 outputs a signal which is delayed from the input signal A by a time equal to the sum of signal delay times of the gates N1, NO1, and N8. The NAND gate NA1 outputs a signal representative of the product of the input signal A and the signal which is inverse in shape with respect to the input signal A and which is delayed from the input signal A by the given time. The output signal from the NAND gate NA1 is inverted by the NOT gate N4, being converted into an output signal G. Therefore, the output signal G has a pulse of a width which corresponds to the sum of the signal delay times of the gates N1, NO1, and N8.

In the case where the power supply voltage lies between 3 volts and 6 volts, the power supply voltage detectors DT1 and DT2 output an "H" signal and an "L" signal to the NAND gates NA2 and NA3 of the pulse width varying circuit PS1 respectively as shown in FIG. 18 so that the NAND gates NA2 and NA3 are opened and closed respectively. As a result, the combination of the gates NA2 and N5–N7 is activated while the combination of the gates NA3 and N25–N27 is deactivated. The NAND gate NA2 of the pulse width varying circuit PS1 outputs a signal reflecting the signal at the output terminal of the NOT gate N1. As shown in FIG. 18, the output signal from the NOT gate N1 is inverse with respect to the input signal A and is delayed from the input signal A by a given time, and the output signal from the NAND gate NA2 is inverse with respect to the signal at the output terminal of the NOT gate N1 and is delayed from the signal at the output terminal of the NOT gate N1 by a given time. The output signal from the NAND gate NA2 is successively inverted by the NOT gates N5–N7 while being delayed by the NOT gates N5–N7 by a given time equal to the sum of signal delay times of the NOT gates N5–N7. Thus, the NOT gate N7 outputs a signal which is inverse with respect to the output signal from the NAND gate NA2 and which is delayed from the output signal from the NAND gate NA2 by the given time as shown in FIG. 18. The output signal from the NOT gate N7 is similar in waveform to the output signal from the NOT gate N1 but is delayed from the output signal from the NOT gate N1 by a given time equal to the sum of the signal delay times of the gates NA2 and N5–N7. The NOR gate NO1 executes the NOR operation between the output signals from the NOT gates N1 and N7, and the output signal from the NOR gate NO1 is inverted by the NOT gate N8 while being delayed by a given time. The NOR gate NO1 outputs a positive pulse which is started synchronously with the change of the output signal from the NOT gate N7 from "H" to "L" and which is ended synchronously with the change of the output signal from the NOT gate N1 from "L" to "H". The output signal from the NOR gate NO1 is inverted by the the NOT gate N8 while being delayed by a given time. As understood from the comparison between the waveforms of the output signals of the NOT gates N1 and N8, the pulse width varying circuit PS1 decreases the width of a negative pulse of the output signal from the NOT gate N1 by effectively delaying the leading edge of the negative pulse but substantially undelaying the trailing edge of the negative pulse. The NAND gate NA1 executes the NAND operation between the input signal A and the output signal from the NOT gate N8, outputting a signal representative of the product of the input signal A and the output signal from the NOT gate N8. Thus, the output signal from the NAND gate NA1 has a negative pulse which is started synchronously with the change of the input signal A from "L" "H" and which is ended synchronously with the change of the output signal of the NOT gate N8 from "H" to "L". The output signal from the NAND gate NA1 is inverted by the NOT gate N4 and is delayed by the NOT gate N4, being converted into the output signal G. Therefore, the output signal G has a positive pulse which is delayed from the negative pulse of the output signal from the NAND gate NA1 by a given time. Since the pulse width varying circuit PS1 effectively delays the change of the output signal of the NOT gate N1 from "H" to "L", the negative pulse of the output signal from the NAND gate NA1 and the positive pulse of the output signal G have a longer width than that obtained when the pulse width varying circuit PS1 is completely deactivated.

In the case where the power supply voltage is equal to or higher than 6 volts, the power supply voltage detectors DT1 and DT2 output an "H" signals to the NAND gates NA2 and NA3 of the pulse width varying circuit PS1 as shown in FIG. 18 so that the NAND gates NA2 and NA3 are opened. As a result, the combination of the gates NA2 and N5–N7 and also the combination of the gates NA3 and N25–N27 are activated. Similarly to the previously-mentioned case, the combination of the gates NA2 and N5–N7 delays the output signal from the NOT gate N1 by the given time. Since the operation of the combination of the gates NA3 and N25–N27 is similar to the operation of the combination of the gates NA2 and N5–N7, the combination of the gates NA3 and N25–N27 delays the output signal from the NOT gate N7 by a given time equal to the sum of signal delay times of the gates NA3 and N25–N27. Thus, as shown in FIG. 18, the output signal from the NOT gate 27 is similar in waveform to the output signal from the NOT gate N1 but is delayed from the output signal from the NOT gate N1 by a given time equal to the sum of the signal delay times of the gates NA2, NA3, N5–N7, and N25–N27. The NOR gate NO1 executes the NOR operation among the output signals from the NOT gates N1, N7, and N 27, and the output signal from the NOR gate NO1 is inverted by the NOT gate N8 while being delayed by a given time. The NOR gate NO1 outputs a positive pulse which is started synchronously with the change of the output signal from the NOT gate N27 from "H" to "L" and which is ended synchronously with the change of the output signal from the NOT gate N1 from "L" to "H". The output signal from the NOR gate NO1 is inverted by the the NOT gate N8 while being delayed by a given time. As understood from the comparison between the waveforms of the output signals of the NOT gates N1 and N8, the pulse width varying circuit PS1 decreases the width of a negative pulse of the output signal from the NOT gate N1 by effectively delaying the leading edge of the negative pulse but substantially undelaying the trailing edge of the negative pulse. The NAND gate NA1 executes the NAND operation between the input signal A and the output signal from the NOT gate N8, outputting a signal representative of the product of the input signal A and the output signal from the NOT gate N8. Thus, the output signal from the NAND gate NA1 has a negative pulse which is started synchronously with the change of the input signal A from "L" to "H" and which is ended synchronously with the change of the output signal of the NOT gate N8 from "H" to "L". The output signal from the NAND gate NA1 is inverted and delayed by the NOT gate N4, being converted into the output signal G. Therefore, the output signal G has a positive pulse which is delayed from the negative pulse of the output signal from the NAND gate NA1 by a given time. Since the pulse width varying circuit PS1 effectively delays the change of the output signal of the NOT gate N1 from "H" to "L", the negative pulse of the output signal from the NAND gate NA1 and the positive pulse of the output signal G have a longer width than that obtained when the pulse width varying circuit PS1 is completely deactivated. Since the NOR gate NO1 responds to the output signal from the NOT gate N27 rather than the output signal from the output signal from the NOT gate N7 and since the output signal from the NOT gate N27 is more delayed from the output signal from the NOT gate 1 than the output signal from the NOT gate 7 is, the negative pulse of the output signal from the NAND gate NA1 and the positive pulse of the output signal G have a longer width than that obtained when the pulse width varying circuit PS1 except the combination of the gates NA3 and N25–N27 is activated.

Figure 19:
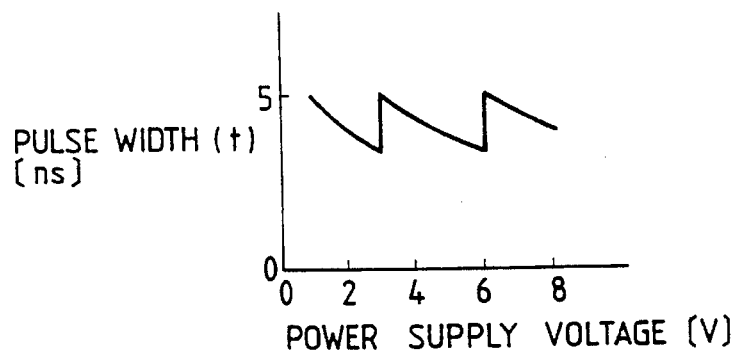
FIG. 19 is a graph showing the relation between the power supply voltage and a pulse width of the output signal from the pulse signal generator of FIG. 16.

As shown in FIG. 19, the width of a pulse in the output signal G decreases as the power supply voltage increases toward 3 volts. When the power supply voltage reaches 3 volts, the width of a pulse in the output signal G is increased by the operation of the pulse width varying circuit PS1 except the combination of the gates NA3 and N25–N27. The width of a pulse in the output signal G again decreases as the power supply voltage increases from 3 volts toward 6 volts. When the power supply voltage reaches 6 volts, the width of a pulse in the output signal G is increased by the operation of the whole of the pulse width varying circuit PS1. The width of a pulse in the output signal G again decreases as the power supply voltage increases above 6 volts. As understood from FIG. 19, the pulse width varying circuit PS1 prevents the pulse width of the output signal G from excessively decreasing at the power supply voltage in a higher range.

DESCRIPTION OF THE FOURTH PREFERRED EMBODIMENT

Figure 20:
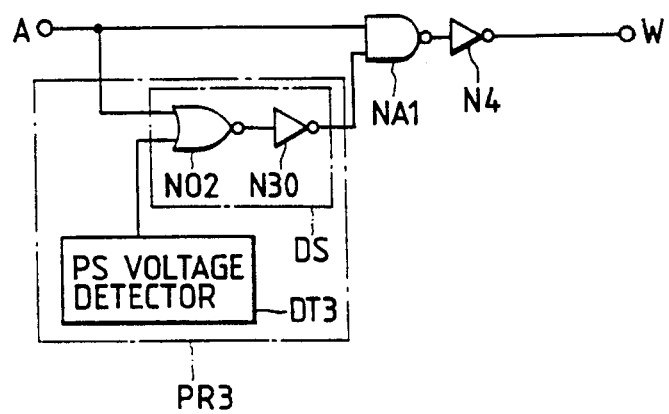
FIG. 20 is a diagram of a pulse signal generator according to a fourth embodiment of this invention.

With reference to FIG. 20, a pulse signal generator includes a pulse signal adjuster PR3 having a delay circuit DS and a power supply voltage detector DT3. The delay circuit DS includes a NOR gate NO2 and a NOT gate N30. A first input terminal of the NOR gate NO2 receives an input signal A. A second input terminal of the NOR gate NO2 receives the output signal from the power supply voltage detector DT3. The NOR gate NO2 executes a NOR operation between the input signal A and the output signal from the power supply voltage detector DT3. The output signal from the NOR gate NO2 is inverted by the NOT gate N30 while being delayed by a given time. The output signal from the NOT gate N30 is applied to a first input terminal of a NAND gate NA1. A second input terminal of the NAND gate NA1 directly receives the input signal A. The NAND gate NA1 executes a NAND operation between the input signal A and the output signal from the NOT gate N30. The output signal from the NAND gate NA1 is inverted by a NOT gate N4, being converted into an output signal W of the pulse signal generator.

Figure 21:
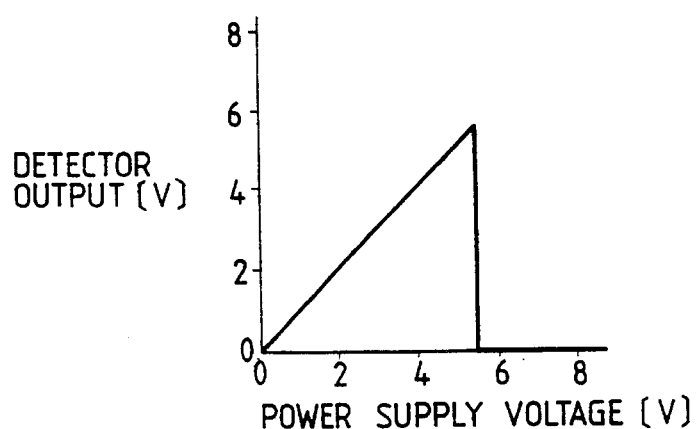
FIG. 21 is a graph showing the relation between a power supply voltage and the output signal voltage of the power supply voltage detector of FIG. 20.

The gates NO2, N30, NA1, and N4 are powered by a common power supply voltage which is detected by the power supply voltage detector DT3. The power supply voltage detector DT3 outputs a voltage signal which varies as a predetermined function of the power supply voltage. Specifically, as shown in FIG. 21, in the case where the power supply voltage is equal to or lower than 5.5 volts, the output voltage from the power supply voltage detector DT3 is equal to the power supply voltage. In this case, the output signal from the power supply voltage detector DT3 is substantially "H". At the power supply voltage higher than 5.5 volts, the output voltage from the power supply voltage detector DT3 is equal to 0 volt. In this case, the output signal from the power supply voltage detector DT3 is "L".

Figure 22:
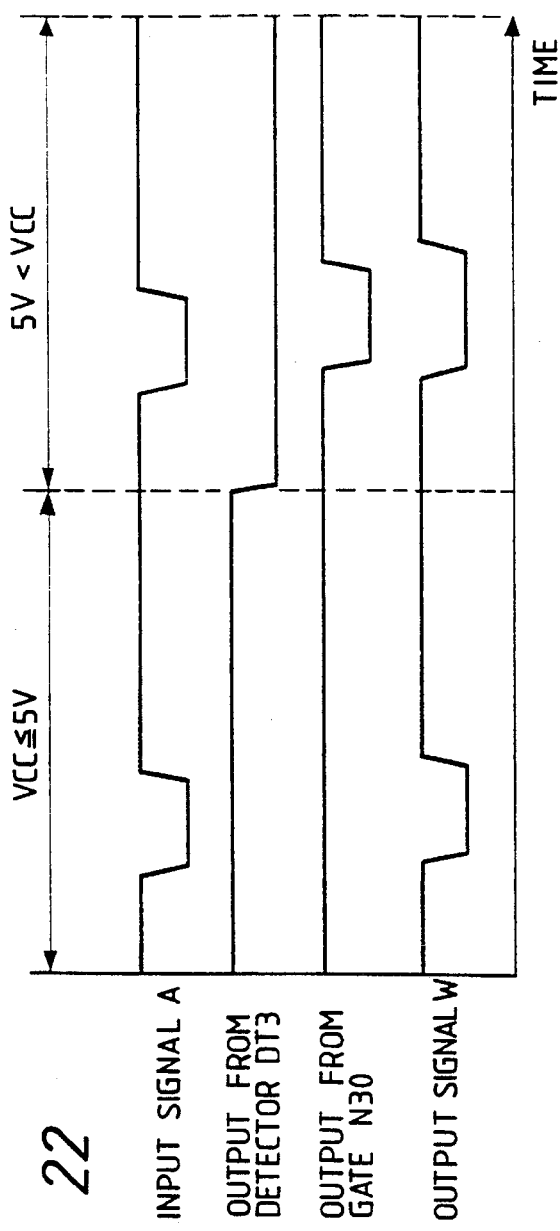
FIG. 22 is a timing diagram showing the waveforms of signals in the pulse signal generator of FIG. 20.

The pulse signal generator of FIG. 20 operates as follows. In the case where the power supply voltage is equal to or lower than 5.5 volts, the power supply voltage detector DT3 outputs an "H" signal to the NOR gate NO2 as shown in FIG. 22 so that the output signal from the NOR gate NO2 remains "L" independent of the state of the input signal A. Thus, the NOT gate N30 continuously outputs an "H" signal to the NAND gate NA1 as shown in FIG. 22, and the NAND gate NA1 remains open. In this case, the input signal A is successively inverted and delayed by the NAND gate NA1 and the NOT gate N4, being converted into the output signal W. As shown in FIG. 22, the output signal W is similar in waveform to the input signal A but is delayed from the input signal A by a given time equal to the sum of signal delay times of the NAND gate NA1 and the NOT gate N4.

In the case where the power supply voltage is higher than 5.5 volts, :he power supply voltage detector DT3 outputs an "L" signal to the NOR gate NO2 as shown in FIG. 22 so that the output signal from the NOR gate NO2 varies in dependence on the gate of the input signal A. The input signal A passes through the NOR gate NO2 and the NOT gate N30 while being delayed and inverted by the NOR gate NO2 and the NOT gate N30. Thus, the NOR gate NO2 and the NOT gate N30 cooperate to delay the input signal A by a given time equal to the sum of signal delay times of the NOR gate NO2 and the NOT gate N30. As shown in FIG. 22, the output signal from the NOT gate N30 is similar in waveform to the input signal A but is delayed from the input signal A by the given time. The NAND gate NA1 executes the NAND operation between the non-delayed input signal and the delayed input signal (the output signal from the NOT gate N30), outputting a signal having a pulse which is started synchronously with the change of the non-delayed input signal from "H" to "L" and which is ended synchronously with the change of the delayed input signal from "L" to "H". The output signal from the NAND gate NA1 is inverted and delayed by the NOT gate N4, being converted into the output signal W. As shown in FIG. 22, the output signal W has a negative pulse which is started substantially synchronously with the change of the non-delayed input signal from "H" to "L" and which is ended substantially synchronously with the change of The delayed input signal (the output signal from The NOT gate N30) from "L" to "H". Thus, the width of the negative pulse of the output signal W is greater than the width of the negative pulse of the input signal H.

Figure 23:
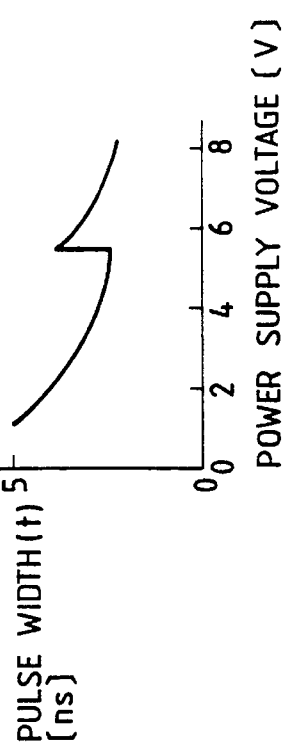
FIG. 23 is a graph showing the relation between the power supply voltage and a pulse width of the output signal from the pulse signal generator of FIG. 20.

As shown in FIG. 23, the width of a pulse in the output signal W decreases as the power supply voltage increases toward 5.5 volts. When the power supply voltage reaches 5.5 volts, the width of a pulse in the output signal W is increased by the operation of the pulse signal adjuster PR3. The width of a pulse in the output signal W again decreases as the power supply voltage increases above 5.5 volts. As understood from FIG. 23, the pulse signal adjuster PR3 prevents the pulse width of The output signal W from excessively decreasing at the power supply voltage in a higher range.

DESCRIPTION OF THE FIFTH PREFERRED EMBODIMENT

Figure 24:
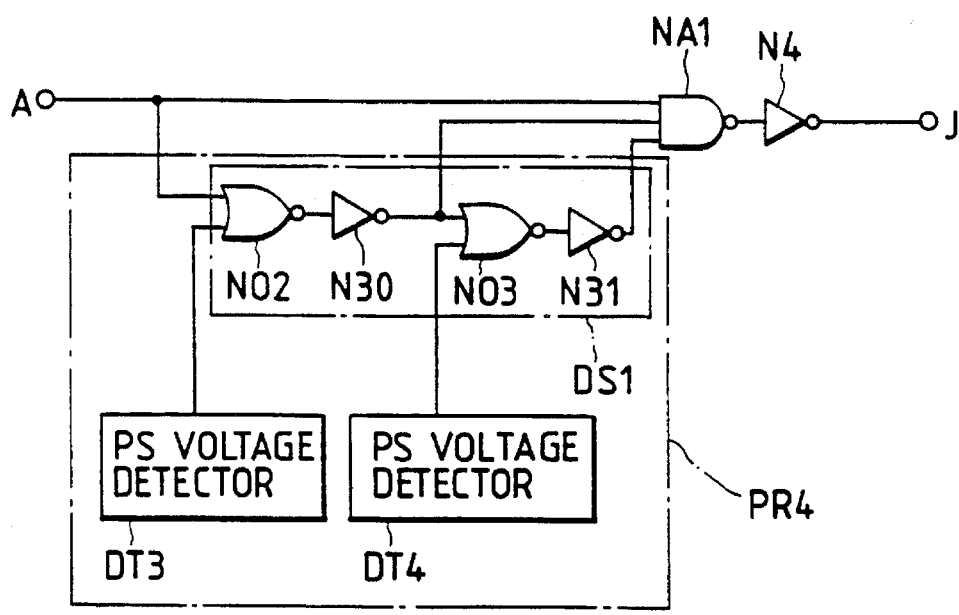
FIG. 24 is a diagram of a pulse signal generator according to a fifth embodiment of this invention.

FIG. 24 shows a pulse signal generator according to a fifth embodiment of this invention which is similar to the embodiment of FIGS. 20–23 except for an additional design indicated hereinafter. The embodiment of FIG. 24 includes a modified pulse signal adjuster PR4 and a modified delay circuit DS1. The pulse signal adjuster PR4 additionally includes a power supply voltage detector DT4. The delay circuit DS1 additionally includes a NOR gate NO3 and a NOT gate N31. A first input terminal of the NOR gate NO3 receives the output signal from a NOT gate N30. A second input terminal of the NOR gate NO3 receives the output signal from the power supply voltage detector DT4. The NOR gate NO3 executes a NOR operation between the output signals from the devices N30 and DT4. The NOT gate N31 follows the NOR gate NO3. The output signal from the NOT gate N31 is applied to a third input terminal of a NAND gate NA1. The NAND gate NA1 executes a NAND operation among an input signal A, the output signal from the NOT gate N30, and the output signal from the NOT gate N31. The output signal from the NAND gate NA1 is inverted and delayed by a NOT gate N4, being converted into an output signal J of the pulse signal generator. The combination of the NOR rate NO3 and the NOT gate N31 operates similarly to the operation of the combination of the NOR gate NO2 and the NOT gate N30.

Figure 25:
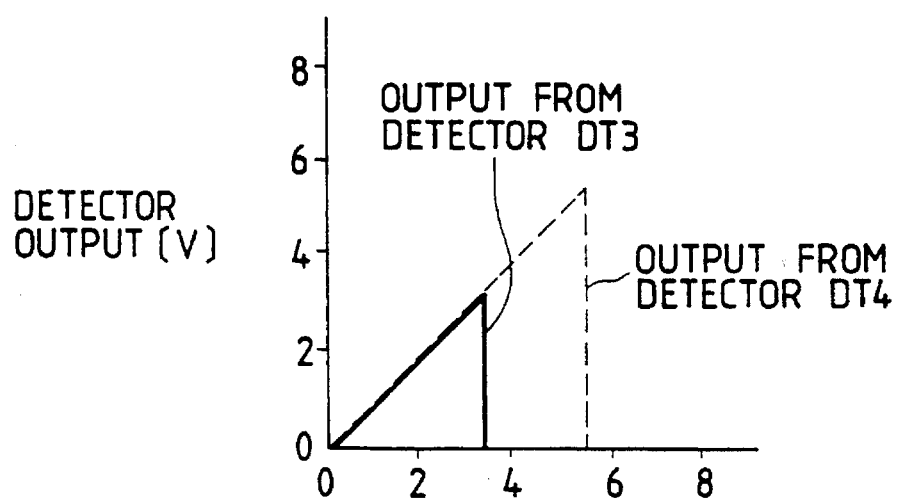
FIG. 25 is a graph showing the relation between a power supply voltage and the output signal voltages of the power supply voltage detectors of FIG. 24.

As shown in FIG. 25, at the power supply voltage being equal to or lower than 3.5 volts, the voltage of the output signal from the power supply voltage detector DT3 is equal to the power supply voltage. In this gase, the output signal from the power supply voltage detector DT3 is substantially "H". At the power supply voltage being higher than 3.5 volts, the voltage of the output signal from the power supply voltage detector DT3 is equal to 0 volt. In this case, the output signal from the power supply voltage detector DT3 is "L".

As shown in FIG. 25, at the power supply voltage being equal to or lower than 5.5 volts, the voltage of the output signal from the power supply voltage detector DT4 is equal to the power supply voltage. In this case, the output signal from the power supply voltage detector DT4 is substantially "H". At the power supply voltage being higher than 5.5 volts, the voltage of the output signal from the power supply voltage detector DT4 is equal to 0 volt. In this case, the output signal from the power supply voltage detector DT4 is "L".

Figure 26:
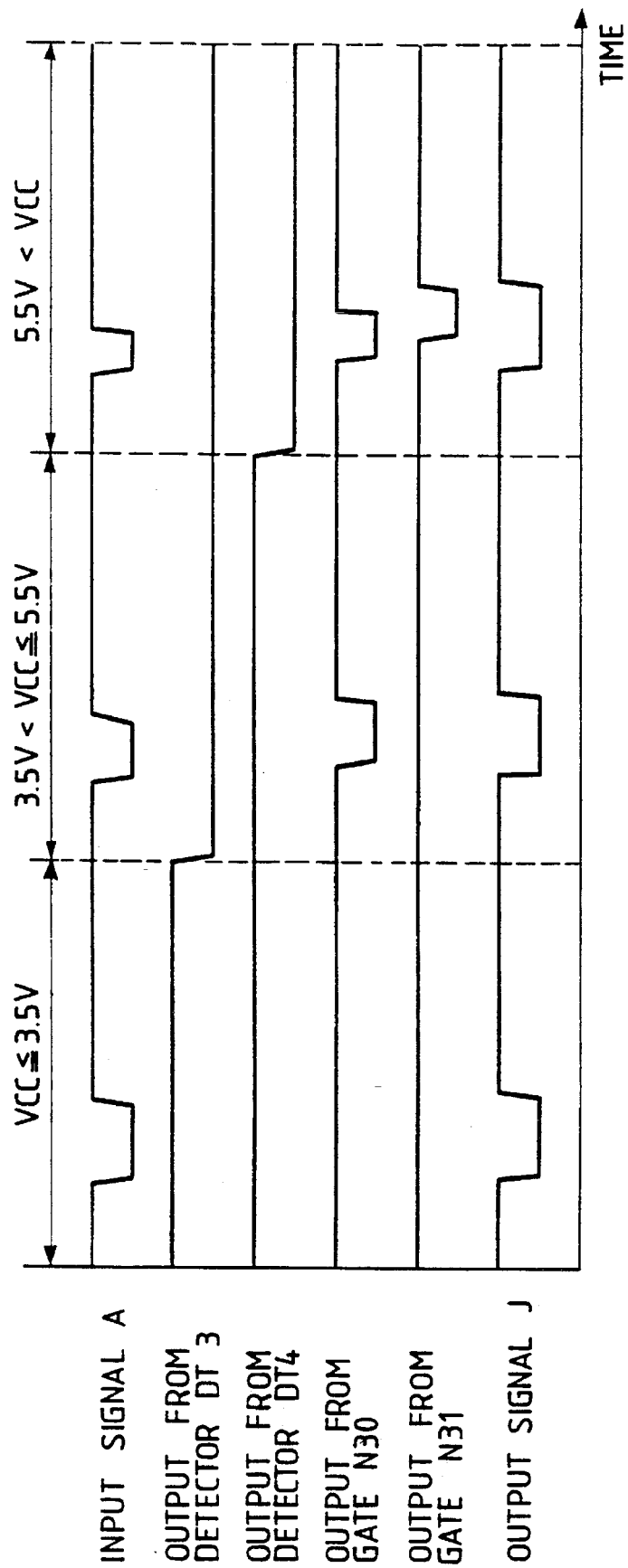
FIG. 26 is a timing diagram showing the waveforms of signals in the pulse signal generator of FIG. 24.

The pulse signal generator of FIG. 24 operates as follows. In the case where the power supply voltage is equal to or lower than 3.5 volts, the power supply voltage detectors DT3 and DT4 output "H" signals to the NOR gates NO2 and NO3 as shown in FIG. 26 so that the output signals from the NOR gates NO2 and NO3 remain "L" independent of the states of the input signal A and the output signal from the NOT gate N30. Thus, the NOT gates N30 and N31 continuously output "H" signals to the NAND gate NA1 as shown in FIG. 26, and the NAND gate NA1 remains open. In this case, the input signal A is successively inverted and delayed by the NAND gate NA1 and the NOT gate N4, being converted into the output signal J. As shown in FIG. 26, the output signal J is similar in waveform to the input signal A but is delayed from the input signal A by a given time equal to the sum of signal delay times of the NAND gate NA1 and the NOT gate N4.

In the case where the power supply voltage lies in the range of 3.5 volts to 5.5 volts, the power supply voltage detectors DT3 and DT4 output an "L" signal and an "H" signal to the NOR gates NO2 and NO3 respectively as shown in FIG. 26 so that the output signal from the NOR gate NO2 varies in dependence on the state of the input signal A while the output signal from the NOR gate NO3 remain "L" independent of the state of the output signal from the NOT gate N30. The input signal A passes through the NOR gate NO2 and the NOT gate N30 while being delayed and inverted by the NOR gate NO2 and the NOT gate N30. Thus, the NOR gate NO2 and the NOT gate N30 cooperate to delay the input signal A by a given time equal to the sum of signal delay times of the NOR gate NO2 and the NOT gate N30. As shown in FIG. 26, the output signal from the NOT gate N30 is similar in waveform to the input signal A but is delayed from the input signal A by the given time. Since the output signal from the NOR gate NO3 remains "L", the NOT gate N31 continuously outputs an "H" signal to the NAND gate NA1 and thus keeps the NAND gate NA1 open. The NAND gate NA1 executes the NAND operation between the non-delayed input signal and the delayed input signal (the output signal from the NOT gate N30), outputting a signal having a pulse which is started synchronously with the change of the non-delayed input signal from "H" to "L" and which is ended synchronously with the change of the delayed input signal from "L" to "H". The output signal from the NAND gate NA1 is inverted and delayed by the NOT gate being converted into the output signal J. As shown in FIG. 26, the output signal J has a negative pulse which is started substantially synchronously with the change of the non-delayed input signal from "H" to "L" and which is ended substantially synchronously with the change of the delayed input signal (the output signal from the NOT gate N30) from "L" to "H". Thus, the width of the negative pulse of the output signal J is greater than the width of the negative pulse of the input signal A.

In the case where the power supply voltage is higher than 5.5 volts, the power supply voltage detectors DT3 and DT4 output "L" signals to the NOR gates NO2 and NO3 as shown in FIG. 26 so that the output signals from the NOR gates NO2 and NO3 vary in dependence on the states of the input signal A and the output signal from the NOT gate N30 respectively. The input signal A passes through the NOR gate NO2 and the NOT gate N30 while being delayed and inverted by the NOR gate NO2 and the NOT gate N30. Thus, the NOR gate NO2 and the NOT gate N30 cooperate to delay the input signal A by a given time equal to the sum of the signal delay times of the NOR gate NO2 and the NOT gate N30. As shown in FIG. 26, the output signal from the NOT gate N30 is similar in waveform to the input signal A but is delayed from The input signal A by the given time. The output signal from the NOT gate N30 is applied to the NAND gate NA1 as an intermediately-delayed input signal. The output signal from the NOT gate N30 passes through the NOR gate NO3 and the NOT gate N31 while being delayed and inverted by the NOR gate NO3 and the NOT gate N31. Thus, the NOR gate NO3 and the NOT gate N31 cooperate to delay the output signal from the NOT gate N30 by a given time equal to the sum of signal delay times of the NOR gate NO3 and the NOT gate N31. As shown in FIG. 26, the output signal from the NOT gate N31 is similar in waveform to the input signal A but is delayed from the input signal A by a given time equal of the sum of the signal delay times of the NOR gates NO2 and NO3 and the NOT gates N30 and N31. The output signal from the NOT gate N31 is applied to the NAND gate NA1 as a greatly-delayed input signal. The NAND gate NA1 executes the NAND operation among the non-delayed input signal, the intermediately-delayed input signal, and the greatly-delayed input signal, outputting a signal having a pulse which is started synchronously with the change of the non-delayed input signal from "H" to "L" and which is ended synchronously with the change of the greatly-delayed input signal from "L" to "H". The output signal from the NAND gate NA1 is inverted and delayed by the NOT gate N4, being converted into the output signal J. As shown in FIG. 26, the output signal J has a negative pulse which is started substantially synchronously with the change of the non-delayed input signal from "H" to "L" and which is ended substantially synchronously with the change of the greatly-delayed input signal (the output signal from the NOT gate N31) from "L" to "H". Thus, the width of the negative pulse of the output signal J is greater than the width of the negative pulse of the input signal A.

Figure 27:
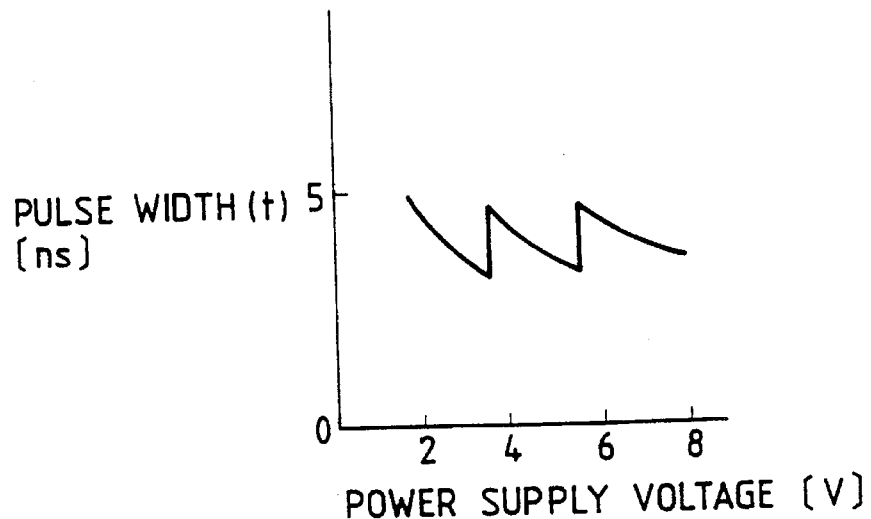
FIG. 27 is a graph showing the relation between the power supply voltage and a pulse width of the output signal from the pulse signal generator of FIG. 24.

As shown in FIG. 27, the width of a pulse in the output signal J decreases as the power supply voltage increases toward 3.5 volts. When the power supply voltage reaches 3 volts, the width of a pulse in the output signal J is increased by the operation of the delay circuit DS1 except the combination of the NOR gate NO3 and the NOT gate N31. The width of a pulse in the output signal J again decreases as the power supply voltage increases from 3.5 volts toward 5.5 volts. When the power supply voltage reaches 5.5 volts, the width of a pulse in the output signal J is increased by the operation of the whole of the delay circuit DS1. The width of a pulse in the output signal J again decreases as the power supply voltage increases above 5.5 volts. As understood from FIG. 27, the pulse signal adjuster PR4 prevents the pulse width of the output signal J from excessively decreasing at the power supply voltage in a higher range.

DESCRIPTION OF THE SIXTH PREFERRED EMBODIMENT

Figure 28:
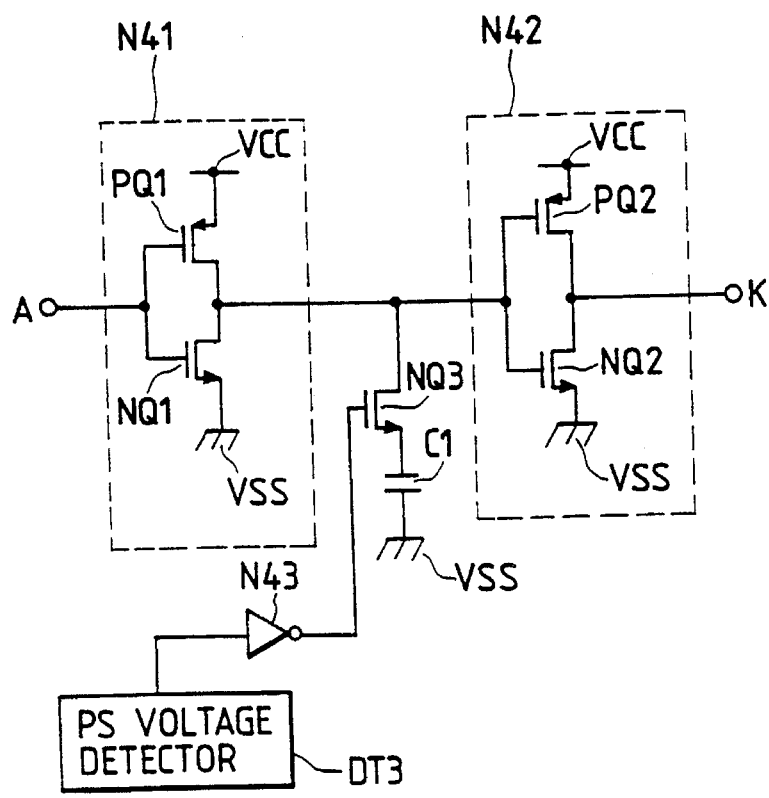
FIG. 28 is a diagram of a pulse signal generator according to a sixth embodiment of this invention.

With reference to FIG. 28, a pulse signal generator includes NOT gates N41, N42, and N43, an N-channel MOS transistor NQ3, a capacitor C1, and a power supply voltage detector DT3. The input terminal of the NOT gate N41 is subjected to an input signal A. The NOT gate N41 inverts the input signal A while delaying the input signal A by a given time. The output terminal of the NOT gate N41 is connected to the input terminal of the NOT gate N42 and the drain of the transistor NQ3. The output signal from the NOT gate N42 is used as an output signal K from the pulse signal generator. The NOT gate N43 receives the output signal from the power supply voltage detector DT3. The NOT gate N43 inverts the output signal from the power supply voltage detector DT3. The output signal from the NOT gate N43 is applied to the gate of the transistor NQ3. The source of the transistor NQ3 is grounded via the capacitor C1.

The NOT gate N41 includes a P-channel MOS transistor PQ1 and an N-channel MOS transistor NQ1. The gates of the transistors PQ1 and NQ1 are connected in common to the input terminal of the NOT gate N41, receiving the input signal A. The source of the transistor PQ1 is subjected to the power supply voltage VCC. The source of the transistor NQ1 is grounded, being subjected to the ground voltage VSS. The drains of the transistors PQ1 and NQ1 are connected in common to the output terminal of the NOT gate N41 which leads to the transistor NQ3 and the NOT gate N42. The transistors PQ1 and NQ1 are designed so that the drive ability of the transistor PQ1 will be greater than the drive ability of the transistor NQ1. In other words, the source-drain resistance (the resistance between the source and the drain) of the transistor PQ1 is smaller than the source-drain resistance of the transistor NQ1. As will be made clear later, this design difference between the transistors PQ1 and NQ1 increases a pulse width in cooperation with the capacitor C1.

The NOT gate N42 includes a P-channel MOS transistor PQ2 and an N-channel MOS transistor NQ2. The gates of the transistors PQ2 and NQ2 are connected in common to the input terminal of the NOT gate N42 which leads from the NOT gate N41 and the transistor NQ3. The source of the transistor PQ2 is subjected to the power supply voltage VCC. The source of the transistor NQ2 is grounded, being subjected to the ground voltage VSS. The drains of the transistors PQ2 and NQ2 are connected in common to the output terminal of the NOT gate N41.

The gates NOT gates N41–N43 are powered by a common power supply voltage which is detected by the power supply voltage detector DT3. The power supply voltage detector DT3 outputs a voltage signal which varies as a predetermined function of the power supply voltage. Specifically, in the case where the power supply voltage is equal to or lower than 5.5 volts, the output voltage from the power supply voltage detector DT3 is equal to the power supply voltage. In this case, the output signal from the power supply voltage detector DT3 is substantially "H". At the power supply voltage higher than 5.5 volts, the output voltage from the power supply voltage detector DT3 is equal to 0 volt. In this case, the output signal from the power supply voltage detector DT3 is "L".

Figure 29:
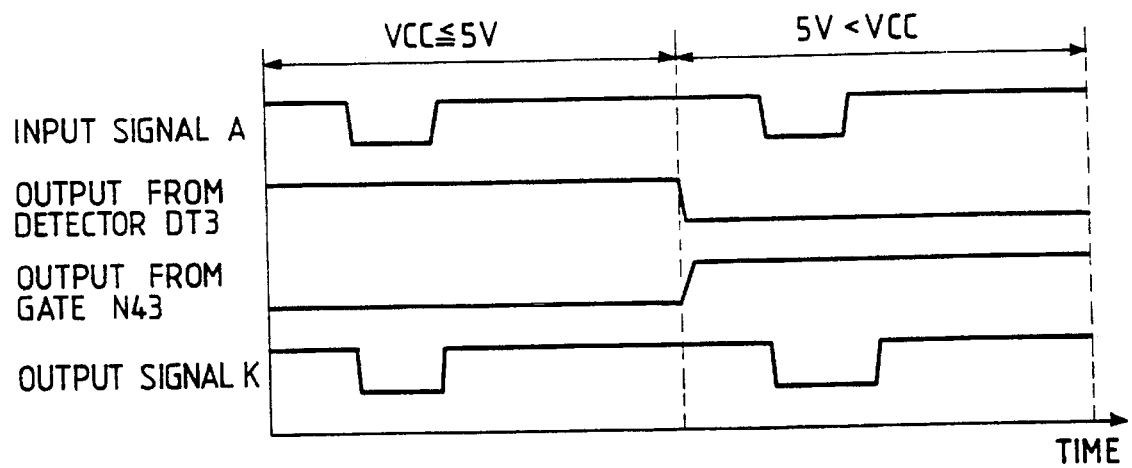
FIG. 29 is a timing diagram showing the waveforms of signals in the pulse signal generator of FIG. 28.

The pulse signal generator of FIG. 28 operates as follows. In the case where the power supply voltage is equal to or lower than 5.5 volts, the output voltage from the power supply voltage detector DT3 is "H" so that the NOT gate N43 outputs an "L" signal to the gate of the transistor NQ3 as shown in FIG. 29. The transistor NQ3 is made non-conductive by the "L" signal outputted from the NOT gate N43, and the capacitor C1 is disconnected from the junction between the NOT gates N41 and N42. In this case, the input signal A is successively inverted and delayed by the NOT gates N41 and N42, being converted into the output signal K. As shown in FIG. 29, the output signal K is similar in waveform to the input signal A but is delayed from the input signal A by a given time equal to the sum of signal delay times of the NOT gates N41 and N42.

In the case where the power supply voltage is higher than 5.5 volts, the output voltage from the power supply voltage detector DT3 is "L" so That the NOT gate N43 outputs an "H" signal to the gate of the transistor NQ3 as shown in FIG. 29. The transistor NQ3 is made conductive by the "H" signal outputted from the NOT gate N43, and the capacitor C1 is connected to the junction between the NOT gates N41 and N42. In this case, when the input signal A changes from "H" to "L", the transistors PQ1 and NQ1 of the NOT gate N41 become conductive and non-conductive respectively so that the capacitor C1 is charged by a current flowing through the source-drain path of the transistor PQ1. Since the source-drain resistance of the transistor PQ1 is small as described previously, the charging current is large and thus the capacitor C1 is quickly charged. As a result, the voltage at the input terminal of the NOT gate N42 quickly rises above the threshold level of the NOT gate N42 and thus changes from "L" to "H", and the output signal K quickly changes from "H" to "L". In this way, as shown in FIG. 29, the change of the output signal K from "H" to "L" responds to the change of the input signal A from "H" to "L" with a small delay time. On the other hand, when the input signal A changes from "L" to "H", the transistors PQ1 and NQ1 of the NOT gate N41 become non-conductive and conductive respectively so that the capacitor C1 is discharged via the source-drain path of the transistor NQ1. Since the source-drain resistance of the transistor PQ is large as described previously, the discharging current is small and thus the capacitor C1 is slowly discharged. As a result, the voltage at the input terminal of the NOT gate N42 slowly drops below the threshold level of the NOT gate N42 and thus changes from "H" to "L", and the output signal K slowly changes from "L" to "H". In this way, as shown in FIG. 29, the change of the output signal K from "L" to "H" responds to the change of the input signal A from "L" to "H" with a great delay time. Thus, a negative pulse in the output signal K has a greater width than a negative pulse in the input signal A.

DESCRIPTION OF THE SEVENTH PREFERRED EMBODIMENT

Figure 30:
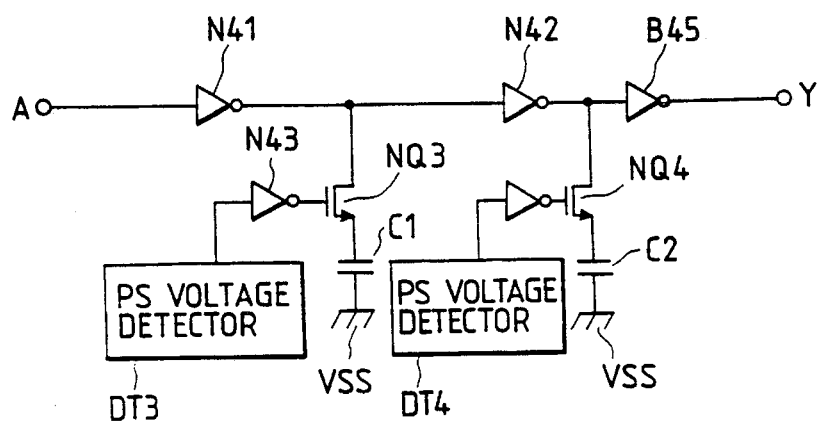
FIG. 30 is a diagram of a pulse signal generator according to a seventh embodiment of this invention.

FIG. 30 shows a pulse signal generator according to a seventh embodiment of this invention which is similar to the embodiment of FIGS. 28 and 29 except for an additional design indicated hereinafter. In the embodiment of FIG. 30, a power supply voltage detector DT3 outputs an "H" signal when a power supply voltage is equal to or lower than 3.5 volts, and the power supply voltage detector DT3 outputs an "L" signal when the power supply voltage exceeds 3.5 volts.

The embodiment of FIG. 30 includes a power supply voltage detector DT4, a NOT gate N44, an N-channel MOS transistor N04, a capacitor C2, and a buffer B45. The power supply voltage detector DT4 outputs an "H" signal when the power supply voltage is equal to or lower than 5.5 volts. The power supply voltage detector DT4 outputs an "L" signal when the power supply voltage exceeds 5.5 volts. The output signal from the power supply voltage detector DT4 is inverted by the NOT gate N44. The output signal from the NOT gate N44 is fed to the gate of the transistor NQ4. The source of the transistor NQ4 is grounded via the capacitor C2. The drain of the transistor NQ4 is connected to the output terminal of a NOT gate N42. The transistor NQ4 serves as a switch for selectively connecting and disconnecting the capacitor C2 to and from the NOT gate N42. The input terminal of the buffer B45 is connected to the output terminal of the NOT gate N42. The output signal from the buffer B45 is used as an output signal Y from the pulse signal generator.

A pair of a P-channel MOS transistor and an N-channel MOS transistor in the NOT gate N42 is designed so that the "H"-to-"L" change of the output signal from the NOT gate N42 will respond to the "L"-to-"H" change of the input signal to the NOT gate N42 with a small delay time and the "L"-to-"H" change of the output signal will respond to the "H"-to-"L" change of the input signal with a great delay time when the capacitor C2 is connected to the NOT gate N42.

Figure 31:
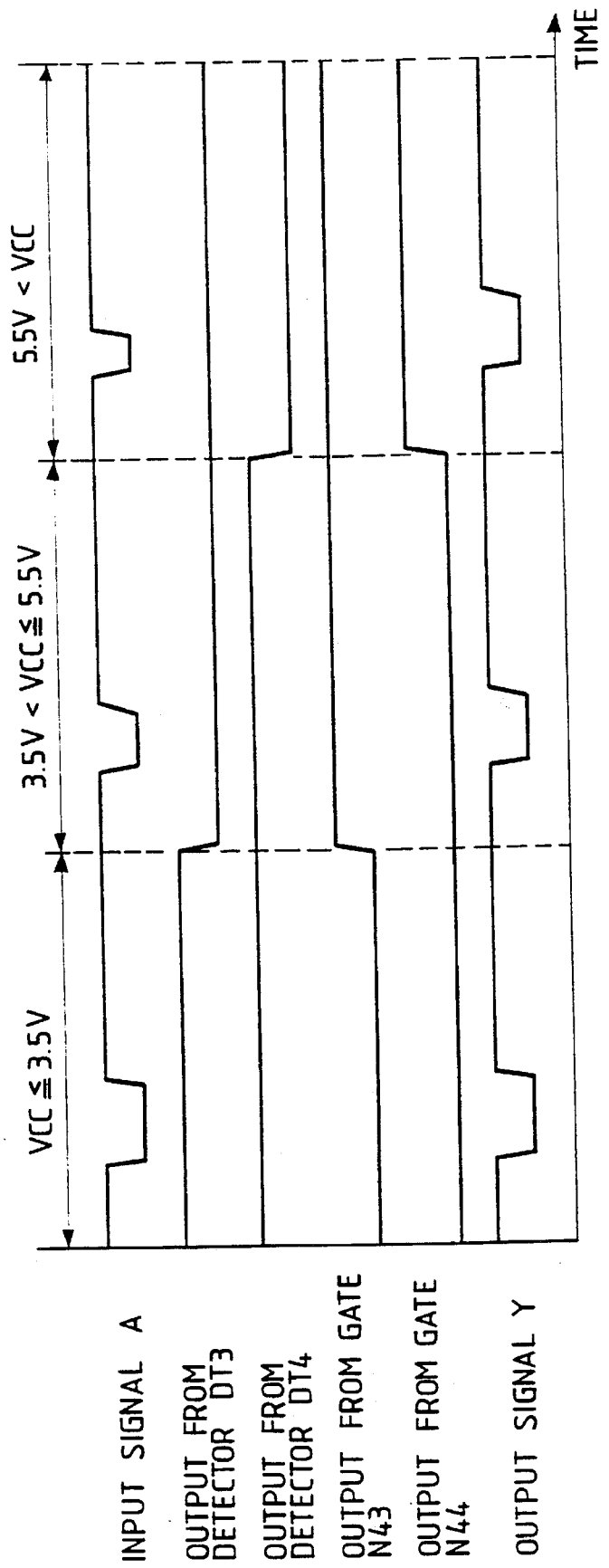
FIG. 31 is a timing diagram showing the waveforms of signals in the pulse signal generator of FIG. 30.

The pulse signal generator of FIG. 30 operates as follows. In the case where the power supply voltage is equal to or lower than 3.5 volts, the power supply voltage detectors DT3 and DT4 output "H" signals to the NOT gates N43 and N44 so that the NOT gates N43 and N44 output "L" signals to the transistors NQ3 and NQ4. The "L" signals outputted from the NOT gates N43 and N44 make the transistors NQ3 and NQ4 non-conductive, disconnecting the capacitors C1 and C2 from the NOT gates N41 and N42. In this case, the input signal A is successively inverted and delayed by the NOT gates N41 and N42, being transmitted through the buffer B45 and being converted into the output signal Y. As shown in FIG. 31, the output signal Y is similar in waveform to the input signal A but is delayed from the input signal A by a given time equal to the sum of signal delay times of the NOT gates N41 and N42 and the buffer B45.

In the case where the power supply voltage lies in the range of 3.5 volts to 5.5 volts, the power supply voltage detectors DT3 and DT4 output an "L" signal and an "H" signal to the NOT gates N43 and N44 respectively so that the NOT gates N43 and N44 output an "H" signal and an "L" signal to the transistors NQ3 and NQ4 respectively as shown in FIG. 31. The "H" signal outputted from the NOT gate N43 makes the transistor NQ3 conductive, connecting the capacitor C1 to the NOT gate N41. The "L" signal outputted from the NOT gate N44 makes the transistor NQ4 non-conductive, disconnecting the capacitor C2 from the NOT gate N42. In this case, as shown in FIG. 31, the width of a negative pulse in the output signal Y is greater than the width of a negative pulse in the input signal A by an intermediate value.

In the case where the power supply voltage is higher than 5.5 volts, the power supply voltage detectors DT3 and DT4 output "L" signals to the NOT gates N43 and N44 so that the NOT gates N43 and N44 output "H" signals to the transistors NQ3 and NQ4. The "H" signals outputted from the NOT gates N43 and N44 make the transistors NQ3 and NQ4 conductive, connecting the capacitors C1 and C2 to the NOT gates N41 and N42. In this case, as shown in FIG. 31, the width of a negative pulse in the output signal Y is greater than the width of a negative pulse in the input signal A by a large value.

DESCRIPTION OF THE EIGHTH PREFERRED EMBODIMENT

Figure 32:
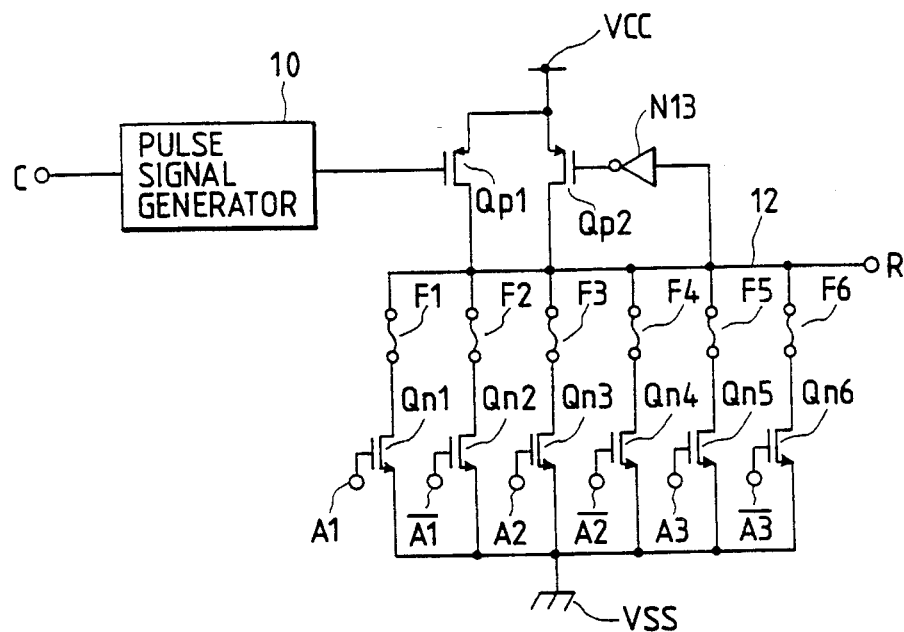
FIG. 32 is a diagram of a redundancy selection signal generator according to an eighth embodiment of this invention.

With reference to FIG. 32, a redundancy selection signal generator includes a pulse signal generator 10 receiving an input signal C. The pulse signal generator 10 is composed of one of the pulse signal generators of FIGS. 20, 24, 28, and 30. The pulse signal generator 10 may be composed of a NOT gate, and one of the pulse signal generators of FIGS. 7, 13, and 16 which is followed by the NOT gate. In the latter case, the output signal from the NOT gate is used as an output signal from the pulse signal generator 10.

As shown in FIG. 32, the redundancy selection signal generator also includes P-channel MOS transistors Qp1 and Qp2, N-channel MOS transistors Qn1–Qn6, fuses F1–F6, and a NOT gate N13. The redundancy selection signal generator is associated with a semiconductor memory (not shown) including redundant memory cells in addition to ordinary memory cells. The redundancy selection signal generator receives an input signal C, and outputs a selection signal R. The selection signal R being "H" represents that a redundant memory cell should be selected in place of an ordinary memory cell. The selection signal R being "L" represents that an ordinary memory cell should be selected. The redundancy selection signal generator also receives address signals A1–A3 and $\overline{A1}$–$\overline{A3}$, a power supply voltage VCC, and a ground voltage VSS. The address signals $\overline{A1}$–$\overline{A3}$ are NOT signals with respect to the address signals A1–A3 respectively. During the operation of the semiconductor memory, the address signals are simultaneously fed to both the redundancy selection signal generator and the semiconductor memory.

The sources of the transistors Qp1 and Qp2 are subjected in common to the power supply voltage VCC. The gate of the transistor Qp1 receives the output signal from the pulse signal generator 10. The drains of the transistors Qp1 and Qp2 are connected in common to an output line 12. The input terminal of the NOT gate N13 is connected to the output line 12. The output terminal of the NOT gate N13 is connected to the gate of the transistor Qp2. First ends of the fuses F1–F6 are connected in common to the output line 12. Second ends of the fuses F1–F6 are connected to the drains of the transistors Qn1–Qn6 respectively. The sources of the transistors Qn1–Qn6 are grounded, being subjected to the ground voltage VSS. The gates of the transistors Qn1, Qn2, Qn3, Qn4, Qn5, and Qn6 receive the address signals A1, $\overline{A1}$, A2, $\overline{A2}$, A3, and $\overline{A3}$ respectively. The selection signal R is induced at the output line 12.

The fuses F1, F2, F3, F4, F5, and F6 are connected to the transistors Qn1, Qn2, Qn3, Qn4, Qn5, and Qn6 which operate in response to the address signals A1, $\overline{A1}$, A2, $\overline{A2}$, A3, and $\overline{A3}$ respectively. Thus, the fuses F1, F2, F3, F4, F5, and F6 correspond to addresses represented by the address signals A1, $\overline{A1}$, A2, $\overline{A2}$, A3, and $\overline{A3}$.

It is now assumed that a defective ordinary memory cell is detected during the check of the semiconductor memory which is performed after the fabrication of the semiconductor memory. Three of the fuses F1–F6 which correspond to the address of the defective memory cell are physically blown before the shipment of the semiconductor memory. As will be explained later, during the operation of the semiconductor memory, when the address signals A1, $\overline{A1}$, A2, $\overline{A2}$, A3, and $\overline{A3}$ assume states corresponding to the defective memory cell, the blown fuses enables the redundancy selection signal generator to output an H-level signal R which allows the selection of a redundant memory cell in place of the defective memory cell.

It is now assumed that the fuses F2, F3, and F5 are previously blown in correspondence with the address of a defective ordinary memory cell. The redundancy selection signal generator of FIG. 32 operates as follows. The input signal C is normally "H". Only when the address signals are in transition, the input signal C assumes "L". The input signal C passes through the pulse signal generator 10, reaching the gate of the transistor Qp1. When the address signals are in transition, the input signal C assumes "L" and then the signal fed to the transistor Qp1 from the pulse signal generator 10 assumes "L". As a result, the transistor Qp1 becomes conductive, and the selection signal R assumes a level corresponding to the power supply voltage VCC.

When the address signals A1, A2, and A3 assume the states corresponding to the addresses of the defective ordinary memory cell, that is, the address signals A1, A2, and A3 assume "L", "H", respectively, the transistors Qn2, Qn3, and Qn5 become conductive. Since the fuses F2, F3, and F5 connected to the transistors Qn2, Qn3, and Qn5 are already blown as described previously, the level of the selection signal R does not drop to the ground voltage VSS and thus the selection signal R remains "H". The inversion of the selection signal R, that is, the "L" signal, is fed to the gate of the transistor Qp2 by the NOT gate N13, so that the transistor Qp2 becomes conductive and the selection signal R remains at the level corresponding to the power supply voltage VCC. In this way, the selection signal R remains "H". In the semiconductor memory, the selection signal R being "H" enables the selection of a redundant memory cell in place of the defective ordinary memory cell.

When the address signals A1, A2, and A3 assume states corresponding to the addresses of normal ordinary memory cells, at least one of the transistors Qn1, Qn4, and Qn6 becomes conductive. Since the fuses F1, F4, and F6 connected to the transistors Qn1, Qn4, and Qn6 are unblown, the level of the selection signal R drops to a level corresponding to the ground voltage VSS and thus the selection signal R goes "L". The inversion of the selection signal R, that is, the "H" signal, is fed to the gate of the transistor Qp2 by the NOT gate N13, so that the transistor Qp2 is non-conductive and the selection signal R reliably falls into and remains at the level corresponding to the ground voltage VSS. In this way, the selection signal R remains "L". In the semiconductor memory, the selection signal R being "L" enables the selection of an ordinary memory cell.

At normal power supply voltages, the pulse signal generator 10 transmits the input signal C to the transistor Qp1 without substantively modifying the input signal C. At high power supply voltages, the pulse signal generator 10 transmits the input signal C to the transistor Qp1 while modifying the input signal C. Specifically, the pulse signal generator 10 widens a pulse in the input signal C by substantially undelaying the leading edge of the pulse but effectively delaying the trailing edge of the pulse. Thus, at high power supply voltages, the width of a pulse applied to the transistor Qp1 is prevented from excessively decreasing, and the timing of the pulse applied to the transistor Qp1 is kept in a good relation with the timing of the address signals applied to the transistors Qn1–Qn6. Accordingly, even at high power supply voltages, the selection signal R remains accurate.

DESCRIPTION OF THE NINTH PREFERRED EMBODIMENT

Figure 33:
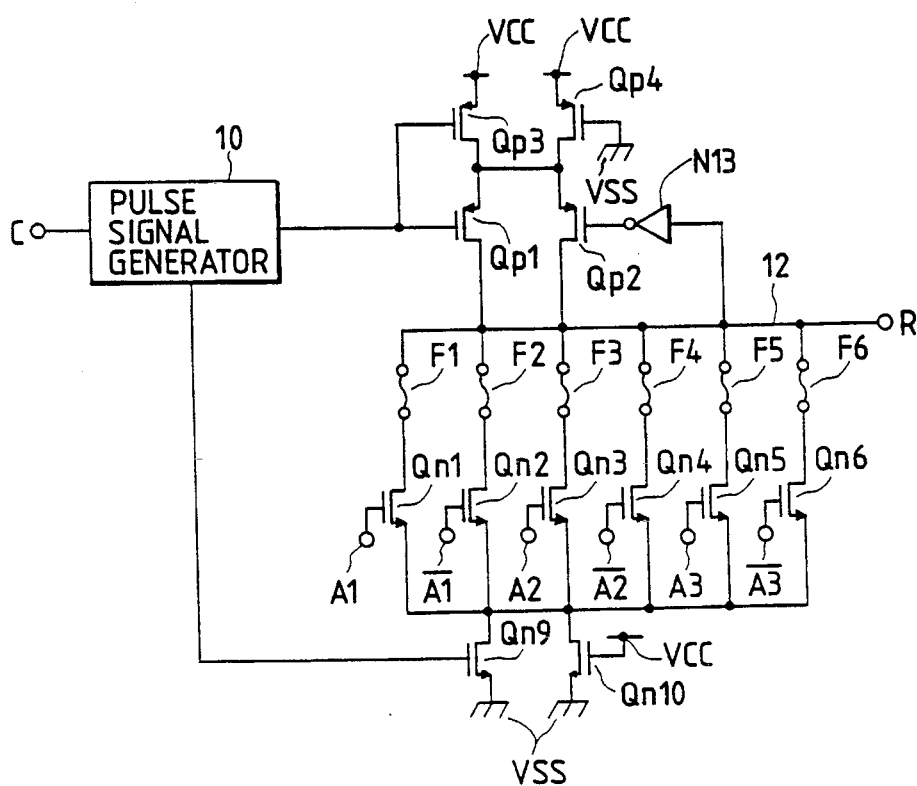
FIG. 33 is a diagram of a redundancy selection signal generator according to a ninth embodiment of this invention.

FIG. 33 shows a redundancy selection signal generator according to a ninth embodiment of this invention which is similar to the embodiment of FIG. 32 except for an additional design indicated hereinafter.

The embodiment of FIG. 33 additionally includes P-channel MOS transistors Qp3 and Qp4, and N-channel MOS transistors Qn9 and Qn10. The sources of transistors Qp1 and Qp2 are connected in common to the drains of the transistors Qp3 and Qp4. The sources of the transistors Qp3 and Qp4 are subjected in common to a power supply voltage VCC. The gate of the transistor Qp3 receives the output signal from a pulse signal generator 10. The gate of the transistor Qp4 is grounded, being subjected to a ground voltage VSS. The transistor Qp4 is continuously conductive. The sources of transistors Qn1–Qn6 are connected in common to the drains of the transistors Qn9 and Qn10. The sources of the transistors Qn9 and Qn10 are grounded, being subjected in common to the ground voltage VSS. The gate of the transistor Qn10 is subjected to the power supply voltage VCC. The transistor Qn10 is continuously conductive. The gate of the transistor Qn9 is connected to a circuit point within the pulse signal generator 10 at which an inverse of the output signal from the pulse signal generator 10 is induced. For example, in the case of the pulse signal generator 10 having a design of FIG. 20, the gate of the transistor Qn9 is connected to the output terminal of a NAND gate NA1.

When the signal fed to the transistor Qp3 from the pulse signal generator 10 assumes "L" and thus the signal fed to the transistor Qn9 from the pulse signal generator 10 assumes "H", the transistors Qp3 and Qn9 are made conductive so that the resistance of the connection of the main part of the redundancy selection signal generator to the power source (which gives the power supply voltage VCC and the ground voltage VSS) is reduced. Otherwise, the transistors Qp3 and Qn9 are non-conductive so that the resistance of the connection of the main part of the redundancy selection signal generator to the power source (which gives the power supply voltage VCC and the ground voltage VSS) is relatively high. As understood from the previous description, the main part of the redundancy selection signal generator is activated and deactivated when the output signal from the pulse signal generator 10 is "L" and "H" respectively. Thus, while the main part of the redundancy selection signal generator remains deactivated, the resistance of the connection of the main part of the redundancy selection signal generator to the power source is relatively high so that the electric power consumed by the main part of the redundancy selection signal generator is reduced.

What is claimed is:

1. An apparatus comprising:

means for detecting a magnitude of a power supply voltage and outputting a representation of the magnitude of the power supply voltage;

means for adjusting a pulse width of an input pulse signal and converting the input pulse signal into a control pulse signal having a pulse width adjusted to differ from the pulse width of the input pulse signal in response to the output signal from the detecting means;

means for generating a redundancy selection signal in response to an address signal; and means responsive to the control pulse signal for selectively activating and deactivating the generating means at times corresponding to starting and ending times of the control pulse signal;

wherein said means for adjusting a pulse width varies the pulse width of the control pulse signal responsive to variation of the power supply voltage from a predetermined value for changing the pulse width of the input pulse signal.

2. An apparatus comprising:

means for detecting a magnitude of a power supply voltage and outputting a signal representative of the magnitude of the power supply voltage;

means for adjusting a pulse width of an input pulse signal and converting the input pulse signal into a control pulse signal having a pulse width adjusted to differ from the pulse width of the input pulse signal in response to the output signal from the detecting means;

means for generating a redundancy selection signal in response to an address signal; and means responsive to the control pulse signal for selectively activating and deactivating the generating means at times corresponding to starting and ending times of the control pulse signal;

wherein said means for adjusting a pulse width is responsive to the power supply voltage for changing the pulse width of the input pulse signal in response to the power supply voltage when the power supply voltage exceeds a predetermined threshold value, and for keeping the pulse width of the input pulse signal substantially unchanged independently of the power supply voltage when the power supply voltage does not exceed the predetermined threshold value.

3. An apparatus comprising:

means for detecting a magnitude of a power supply voltage and providing an output corresponding to the magnitude of the power supply voltage;

means for adjusting a pulse width of an input pulse signal and converting the input pulse signal into a control pulse signal having a pulse width adjusted to differ from the pulse width of the input pulse signal in response to the output from the detecting means;

means for generating a redundancy selection signal in response to an address signal; and means responsive to the control pulse signal for selectively activating and deactivating the generating means at times corresponding to starting and ending times of the control pulse signal;.

wherein the output from the detecting means comprises two different signals, wherein said detecting means comprises first and second power supply voltage detectors, each detector outputting a respective fixed voltage level for magnitudes of said power supply voltage in a respective first range and a respective voltage level which varies in accordance with variation of said power supply voltage in a respective second range separated from said respective first range by a respective voltage threshold value, and wherein said first and second power supply voltage detectors have different respective voltage threshold values thereby to provide said two different signals corresponding to the magnitude of the power supply voltage in three different voltage ranges, said adjusting means responsive to said two different signals by providing three different adjustments to said pulse width of the input pulse signal to obtain the pulse width of said control pulse signal.

4. An apparatus comprising:

means for detecting magnitude of a power supply voltage and outputting a signal corresponding to the magnitude of the power supply voltage;

means for adjusting a pulse width of an input pulse signal and converting the input pulse signal into a control pulse signal having a pulse width adjusted to differ from the pulse width of the input pulse signal in response to the output signal from the detecting means;

means for generating a redundancy selection signal in response to an address signal; and means responsive to the control pulse signal for selectively activating and deactivating the generating means at times corresponding to starting and ending times of the control pulse signal;

wherein the output signal from the detecting means comprises two different portions having respectively different relationships to the magnitude of the power supply voltage, wherein said two different portions of the output signal from the detecting means include first and second separate portions, and wherein:

said detecting means provides said first portion of the output signal from the detecting means as a first response to the magnitude of the power supply voltage when the magnitude of the power supply voltage is in a first range of values, and said detecting means provides said second portion of the output signal from the detecting means as a second response to the magnitude of the power supply voltage, different from said first response, when the magnitude of the power supply voltage is in a second range of values different from said first range, wherein said first response is a substantially fixed and said detecting means provides said first portion of the signal from the detecting means as a substantially fixed level of output voltage representing the magnitude of the power supply voltage as being in said first range of values, and wherein said second function is a value varying with the magnitude of the power supply voltage, and said detecting means provides said second portion of the output signal from the detecting means as a varying level of output voltage which varies with the magnitude of the power supply voltage when the magnitude of the power supply voltage is in said second range of values.

5. The apparatus of claim 4 wherein said detecting means provides said second portion of the output signal from the detecting means as a voltage level substantially equal to the magnitude of the power supply voltage when the magnitude of the power supply voltage is in said second range of values.

6. The apparatus of claim 5 wherein said second range of values includes values of voltage levels higher than values of voltage levels in said first range of values.

7. An apparatus comprising:

means for detecting a magnitude of a power supply voltage and outputting a signal corresponding to the magnitude of the power supply voltage;

means for adjusting a pulse width of an input pulse signal and converting the input pulse signal into a control pulse signal having a pulse width adjusted to differ from the pulse width of the input pulse signal in response to the output signal from the detecting means;

means for generating a redundancy selection signal in response to an address signal; and means responsive to the control pulse signal for selectively activating and deactivating the generating means at times corresponding to starting and ending times of the control pulse signal;

wherein the output signal from the detecting means comprises two different portions having respectively different relationships to the magnitude of the power supply voltage, wherein said two different portions of the output signal from the detecting means include first and second separate portions, and wherein:

said detecting means provides said first portion of the output signal from the detecting means as a first response to the magnitude of the power supply voltage when the magnitude of the power supply voltage is in a first range of values, and said detecting means provides said second portion of the output signal from the detecting means as a second response to the magnitude of the power supply voltage, different from said first response, when the magnitude of the power supply voltage is in a second range of values different from said first range, wherein said second function is a value varying with the magnitude of the power supply voltage, and said detecting means provides said second portion of the output signal from the detecting means as a varying level of output voltage which varies with the magnitude of the power supply voltage when the magnitude of the power supply voltage is in said second range of values.

8. The apparatus of claim 7 wherein said detecting means provides said second portion of the output signal from the detecting means as a voltage level substantially equal to the magnitude of the power supply voltage when the magnitude of the power supply voltage is in said second range of values.

9. The apparatus of claim 8 wherein said second range of values includes values of voltage levels higher than values of voltage levels in said first range of values.

* * * * *